(12) United States Patent
Takeuchi

(10) Patent No.: US 8,143,964 B2
(45) Date of Patent: *Mar. 27, 2012

(54) METHOD FOR GENERATING A PWM SIGNAL

(75) Inventor: Kesatoshi Takeuchi, Shiojiri (JP)

(73) Assignee: Seiko Epson Corporation (JP)

( * ) Notice: Subject to any disclaimer, the term of this patent is extended or adjusted under 35 U.S.C. 154(b) by 73 days.

This patent is subject to a terminal disclaimer.

(21) Appl. No.: 12/777,497

(22) Filed: May 11, 2010

(65) Prior Publication Data

US 2010/0219899 A1    Sep. 2, 2010

Related U.S. Application Data

(63) Continuation of application No. 12/260,140, filed on Oct. 29, 2008, now Pat. No. 7,741,927.

(30) Foreign Application Priority Data

Nov. 7, 2007    (JP) .................................. 2007-289222

(51) Int. Cl.
G05B 11/28    (2006.01)
H03K 7/08    (2006.01)

(52) U.S. Cl. ................ 332/109; 318/445; 318/599
(58) Field of Classification Search .......... 332/109–111; 327/171–177; 318/445, 461–465, 599
See application file for complete search history.

(56) References Cited

U.S. PATENT DOCUMENTS

| 4,998,257 | A | 3/1991 | On et al. |
| 5,185,584 | A | 2/1993 | Takeuchi |
| 7,741,927 | B2 * | 6/2010 | Takeuchi ............... 332/109 |

FOREIGN PATENT DOCUMENTS

JP    2004-364366    12/2004

* cited by examiner

*Primary Examiner* — David Mis
(74) *Attorney, Agent, or Firm* — Harness, Dickey & Pierce, P.L.C.

(57) ABSTRACT

The PWM control circuit is provided. The PWM control circuit includes: a PWM control signal generator that generates a PWM period signal defining a period of a PWM signal and a PWM resolution signal specifying a resolution in one period of the PWM period signal; and a PWM unit that generates the PWM signal based on the PWM period signal and the PWM resolution signal, wherein the PWM control signal generator changes a frequency of the PWM resolution signal while keeping a frequency of the PWM period signal unchanged.

1 Claim, 25 Drawing Sheets

Back electromotive force Ec

Speed increase

Sensor output SSA

Sensor output SSB

Forward rotation
Immediately before phase = 0

Immediately before phase = $\pi/2$

Immediately before phase = $\pi$

Immediately before phase = $3\pi/2$

Reverse rotation

Immediately before
phase = 0

Immediately before
phase = $\pi/2$

Immediately before
phase = $\pi$

Immediately before
phase = $3\pi/2$

Fig.7
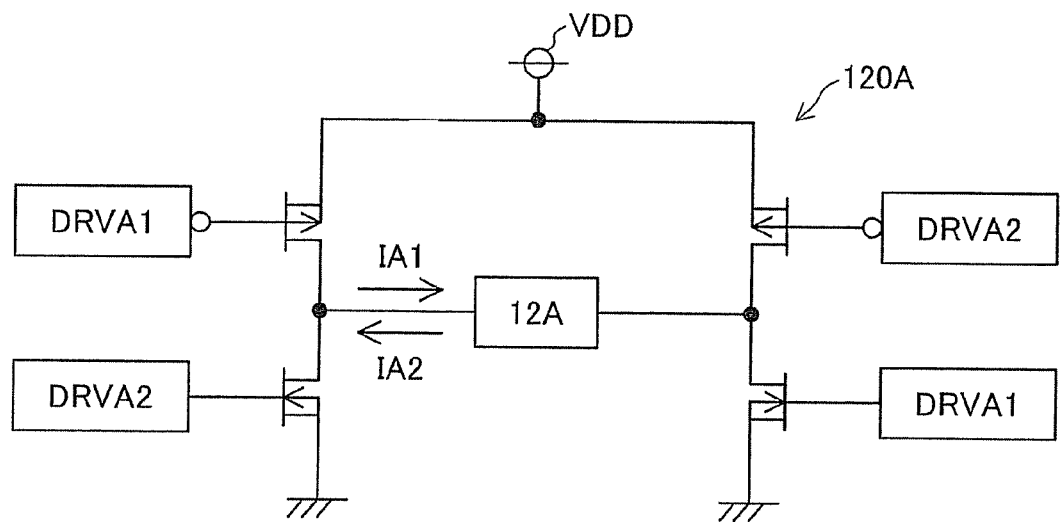
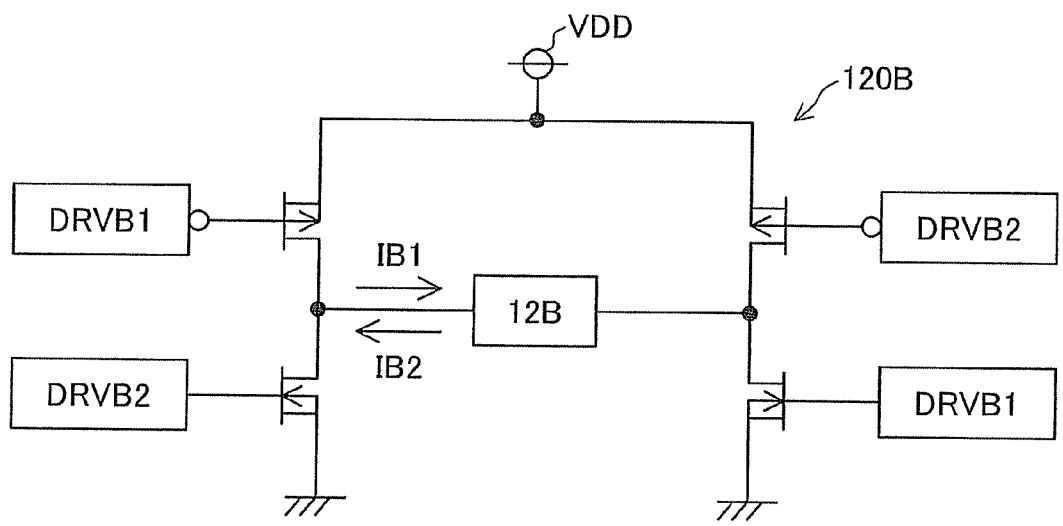

Sensor output: VDD～VDD／2～GND
AD converter output: FFh～80h,7Fh～0h
Encoder outputs Xa: +127～0,0～-127
Control valueYa: 0.0～1.0
Multiplication valueMa: INT(Xa×Ya)

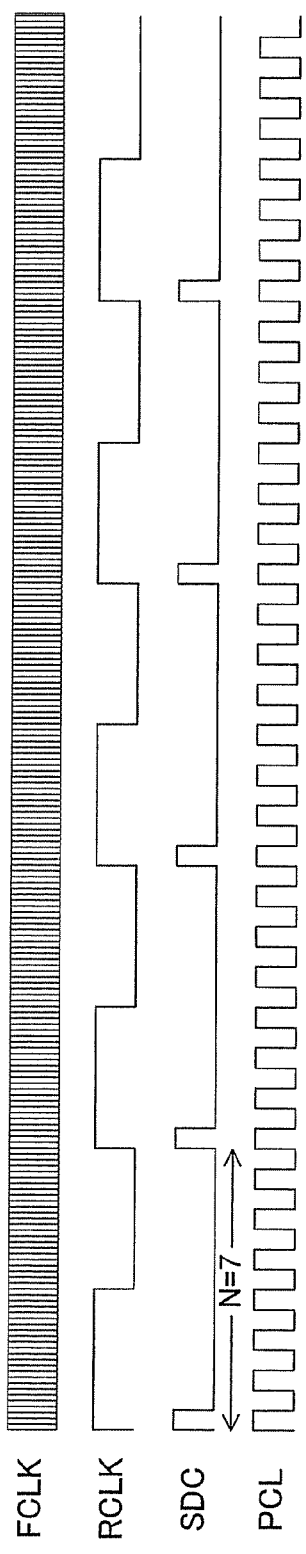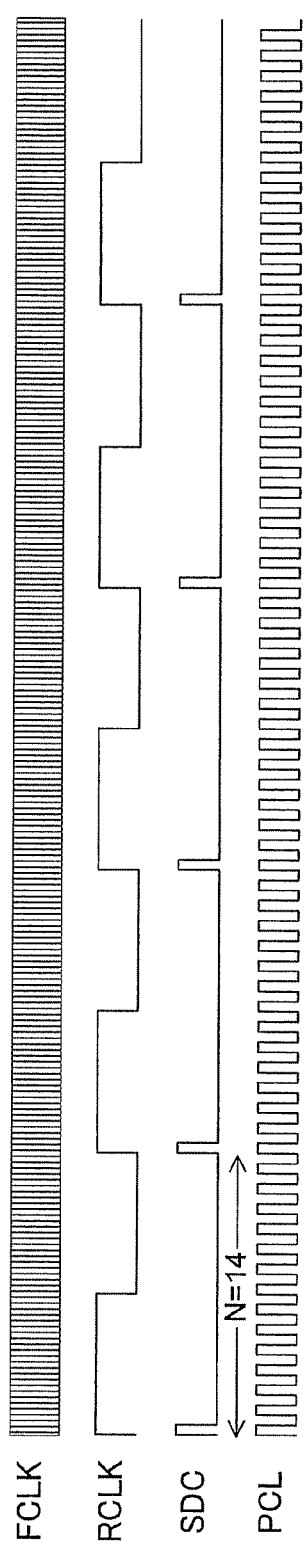

Fig.12A
SSA
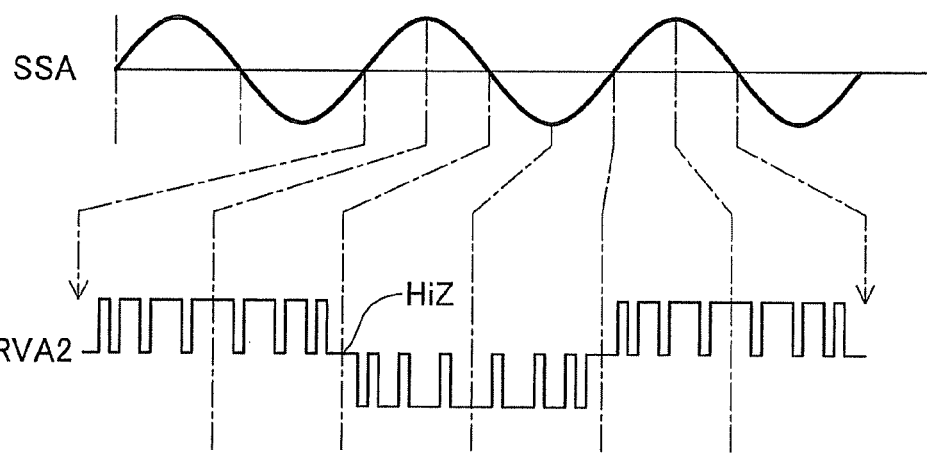
Fig.12B
DRVA1+DRVA2
Fig.12C
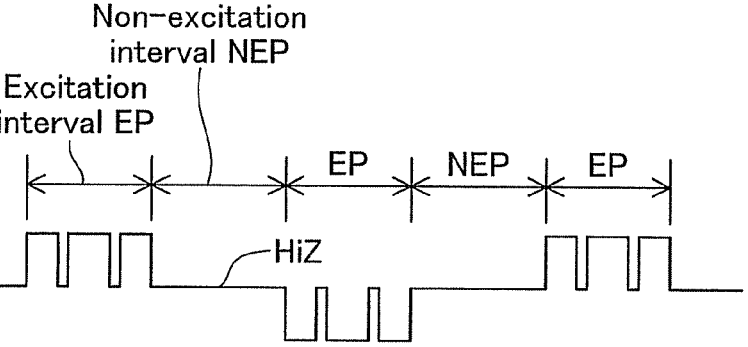
DRVA1+DRVA2

During forward rotation (RI = "L")

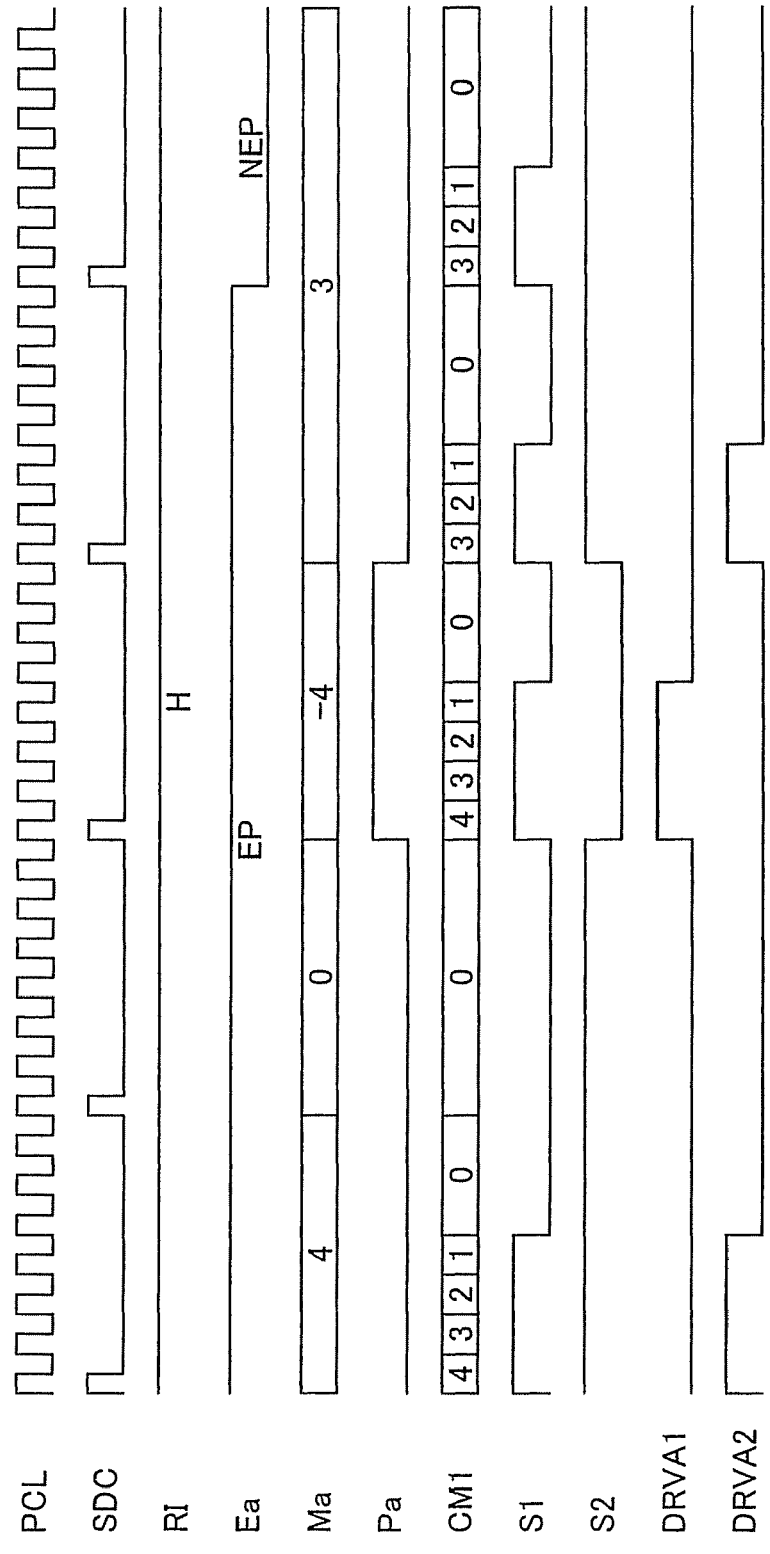

Driving by rectangular wave

Current attenuates in association with increased speed

Driving by sine wave

Current attenuates in association with increased speed

Fig.18
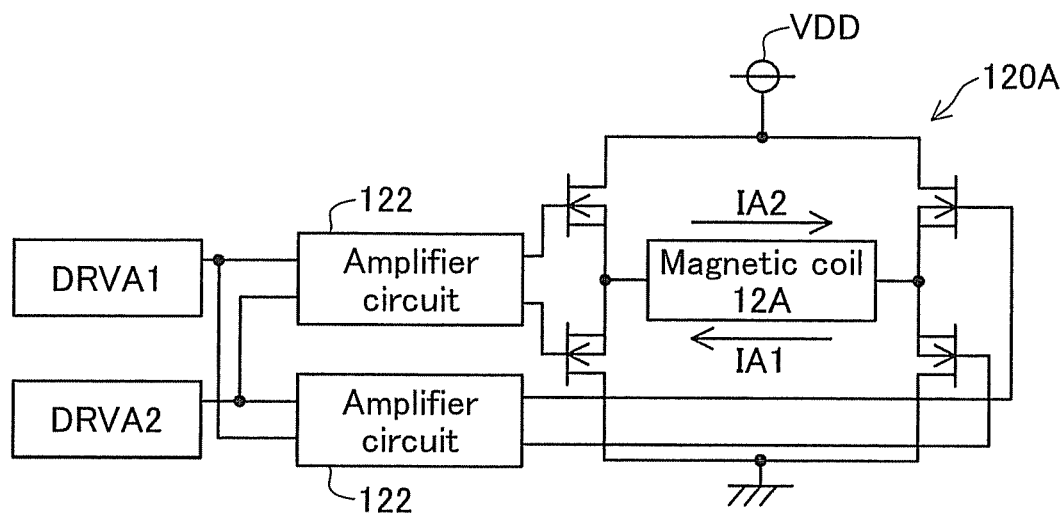
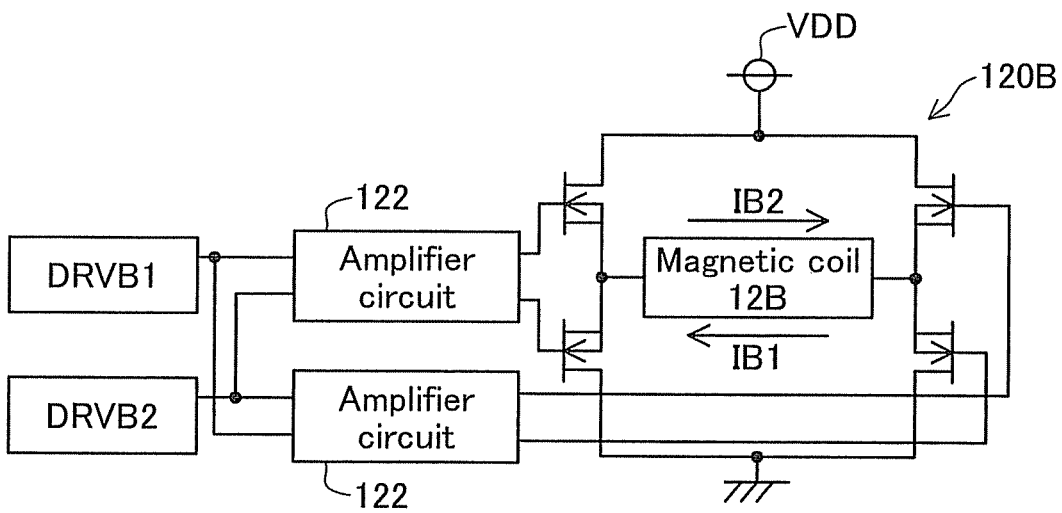

METHOD FOR GENERATING A PWM SIGNAL

CROSS-REFERENCE TO RELATED APPLICATIONS

This is a continuation application of U.S. Ser. No. 12/260,140 filed Oct. 29, 2008, which claims priority to Japanese Patent Application No. 2007-289222 filed on Nov. 7, 2007, all of which are hereby incorporated by reference in their entirety.

BACKGROUND OF THE INVENTION

1. Field of the Invention

The present invention relates to PWM control.

2. Description of the Related Art

One proposed PWM control technique is disclosed in Japanese Patent Laid-Open No. 2004-364366.

This related art technique forms a PWM fundamental wave from a basic frequency signal of a preset frequency and divides the frequency of the PWM fundamental wave to generate a PWM period signal. The PWM fundamental wave specifies a resolution to set a duty cycle in one period of the PWM period signal.

In a system of this related art technique, a change in frequency of the PWM fundamental wave for varying the accuracy of PWM control leads to a change in frequency of the PWM period signal. The changed frequency of the PWM period signal may coincide with a resonance frequency of a load structure (for example, a motor main body) under PWM control to cause undesirable vibration and noise.

SUMMARY

An object of the present invention is to provide technology that is able to allow a change of a resolution in one period of a PWM period signal constructed to define a period of a PWM signal, while keeping a frequency of the PWM period signal unchanged.

According to an aspect of the present invention, a PWM control circuit is provided. The PWM control circuit comprises: a PWM control signal generator that generates a PWM period signal defining a period of a PWM signal and a PWM resolution signal specifying a resolution in one period of the PWM period signal; and a PWM unit that generates the PWM signal based on the PWM period signal and the PWM resolution signal, wherein the PWM control signal generator changes a frequency of the PWM resolution signal while keeping a frequency of the PWM period signal unchanged.

The PWM control circuit according to this aspect of the invention allows a change of the resolution in one period of the PWM period signal, while keeping the frequency of the PWM period signal unchanged.

The present invention may be actualized by diversity of other applications, for example, a PWM control method, a PWM control device, a PWM control system, integrated circuits configured to attain the functions of PWM control, computer programs configured to attain the functions of PWM control, and recording media where such computer programs are recorded.

BRIEF DESCRIPTION OF THE DRAWINGS

FIG. 7 shows a configuration of a phase A driver circuit 120A and a phase B driver circuit 120B included in the driver circuit 150;

FIGS. 11A and 11B are timing charts showing the operations of the fixed clock signal FLCK, the frequency-divided clock signal RCLK, the clock signal SDC, and the clock signal PCL;

FIGS. 12A-12C depict correspondence between sensor output waveform and waveform of the drive signals generated by the PWM unit 530;

FIG. 15 is a timing chart depicting operation of the PWM unit 530 during reverse rotation of the motor;

FIG. 18 depicts another configuration example of the phase A driver circuit 120A and the phase B driver circuit 120B included in the driver circuit 150;

DESCRIPTION OF THE PREFERRED EMBODIMENT

Next, aspects of the present invention will be described in the following order on the basis of embodiments:
A. First Embodiment:
   A1. Overview of Motor Configuration and Operation:
   A2. Configuration of Drive Circuit Unit:
B. Second Embodiment:
C. Modified Examples:

A. First Embodiment

A1. Overview of Motor Configuration and Operation

Figure 1A:
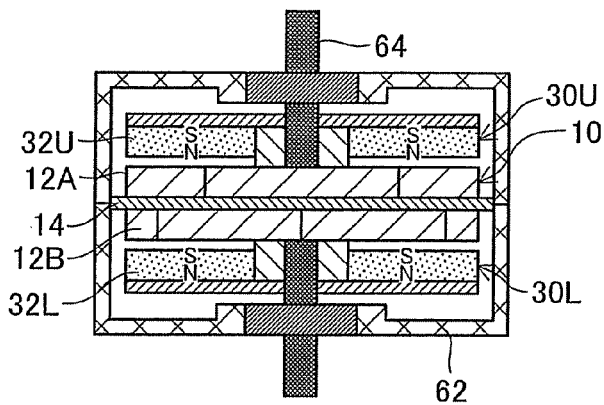
FIG. 1A depicts in sectional view the configuration of the motor unit of a brushless motor pertaining to a first embodiment of the present invention.
Figure 1B:
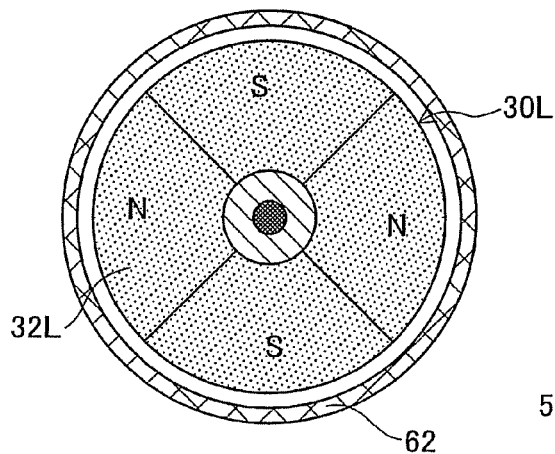
FIG. 1B is a horizontal sectional view of the lower rotor portion 30L.

FIG. 1A depicts in sectional view the configuration of the motor unit of a brushless motor pertaining to a first embodiment of the present invention. This motor unit has a stator portion 10, an upper rotor portion 30U, and a lower rotor portion 30L. Each of these components 10, 30U, 30L has generally disk-shaped contours. FIG. 1B is a horizontal sectional view of the lower rotor portion 30L. The lower rotor portion 30L has four permanent magnets 32L each having generally fan-shaped contours. The upper rotor portion 30U is identical in design to the lower rotor portion 30L and has been omitted from the illustration. The upper rotor portion 30U and the lower rotor portion 30L are fastened to a center shaft 64 and rotate simultaneously. The direction of magnetization of the magnets 32U, 32L is parallel to the rotating shaft 64.

Figure 1C:
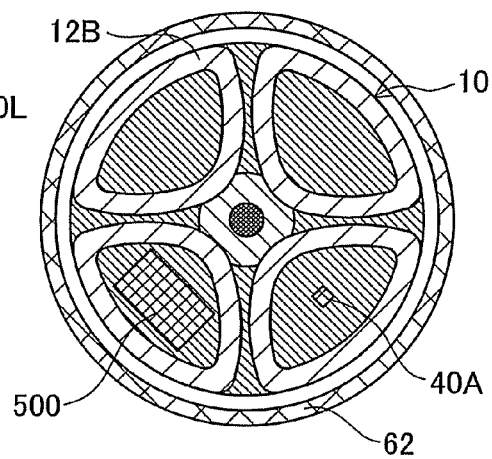
FIG. 1C is a horizontal sectional view of the stator portion 10.

FIG. 1C is a horizontal sectional view of the stator portion 10. As shown in FIG. 1A, the stator portion 10 has a plurality of phase A coils 12A, a plurality of phase B coils 12B, and a support member 14 supporting these coils 12A, 12B. FIG. 1C depicts the phase B coils 12B. In this example, there are provided four phase B coils 12B each of which is wound in a fan-shaped configuration. The phase A coils 12A have this same design. A drive circuit unit 500 is installed in the stator portion 10 as well. As shown in FIG. 1A, the stator portion 10 is fixed in a casing 62.

Figure 1D:
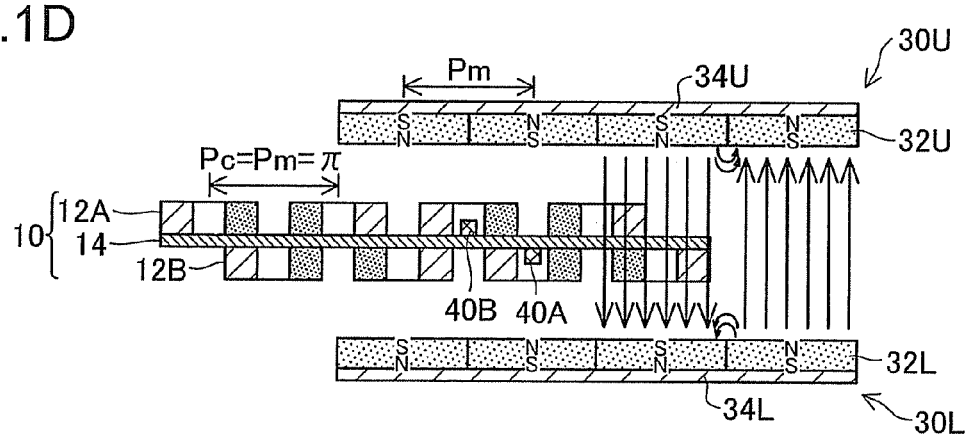
FIG. 1D is a conceptual diagram depicting the relationship of the stator portion 10 and the two rotor portions 30U, 30L.

FIG. 1D is a conceptual diagram depicting the relationship of the stator portion 10 and the two rotor portions 30U, 30L. On the support member 14 of the stator portion 10 are provided a magnetic sensor 40A for phase A use and a magnetic sensor 40B for phase B use. The magnetic sensors 40A, 40B are used to detect the position of the rotor portions 30U, 30L (i.e. the phase of the motor). These sensors will hereinafter be referred to as the "phase A sensor" and the "phase B sensor." The phase A sensor 40A is positioned at a center location between two of the phase A coils 12A. Similarly, the phase B sensor 40B is positioned at a center location between two of the phase B coils 12B. In this example, the phase A sensor 40A is positioned together with the phase B coils 12B at the lower face of the support member 14, but it could instead be positioned at the upper face of the support member 14. This applies to the phase B sensor 40B as well. As will be understood from FIG. 1C, in this embodiment, the phase A sensor 40A is positioned inside one of the phase B coils 12B, which has the advantage of ensuring space for placement of the sensor 40A.

As shown in FIG. 1D, the magnets 32U, 32L are each positioned at a constant magnetic pole pitch Pm, with adjacent magnets being magnetized in opposite directions. The phase A coils 12A are arranged at constant pitch Pc, with adjacent coils being excited in opposite directions. This applies to the phase B coils 12B as well. In the present embodiment, the magnetic pole pitch Pm is equal to the coil pitch Pc, and in terms of electrical angle is equivalent to $\pi$. An electrical angle of $2\pi$ is associated with the mechanical angle or distance of displacement when the phase of the drive signal changes by $2\pi$. In the present embodiment, when the phase of the drive signal changes by $2\pi$, the rotor portions 30U, 30D undergo displacement by the equivalent of twice the magnetic pole pitch Pm. The phase A coils 12A and the phase B coils 12B are positioned at locations phase-shifted by $\pi/2$ from each other.

The magnets 32U of the upper rotor portion 30U and the magnets 32L of the lower rotor portion 30L are positioned with their magnetic poles which face towards the stator portion 10 having mutually different polarity (N pole and S pole). In other words, the magnets 32U of the upper rotor portion 30U and the magnets 32L of the lower rotor portion 30L are positioned with their opposite poles facing one another. As a result, as shown at the right end in FIG. 1D, the magnetic field between these magnets 32U, 32L will be represented by substantially straight magnetic field lines and will be closed between these magnets 32U, 32L. It will be appreciated that this closed magnetic field is stronger than the open magnetic field shown in FIG. 26 discussed previously. As a result, magnetic field utilization efficiency will be higher, and it will be possible to improve motor efficiency. In preferred practice, magnetic yokes 34U, 34L made of a ferromagnetic body will be disposed respectively on the outside faces of the magnets 32U, 32L. The magnetic yokes 34U, 34L make it possible to further strengthen the magnetic field in the coils. However, the magnetic yokes 34U, 34L may be omitted.

Figure 2A:
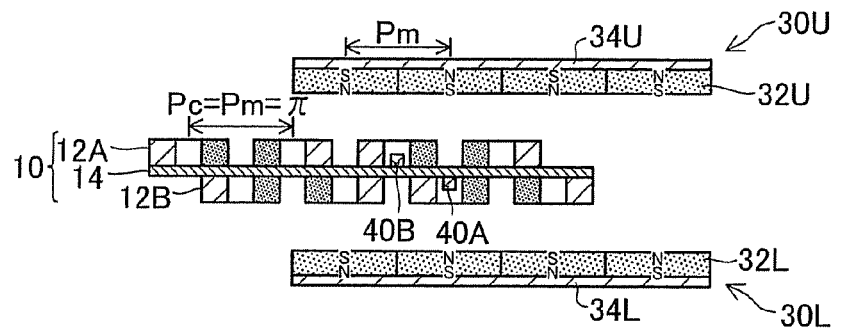
FIGS. 2A-2D illustrate the relationship of sensor output and back electromotive force waveform.
Figure 2B:
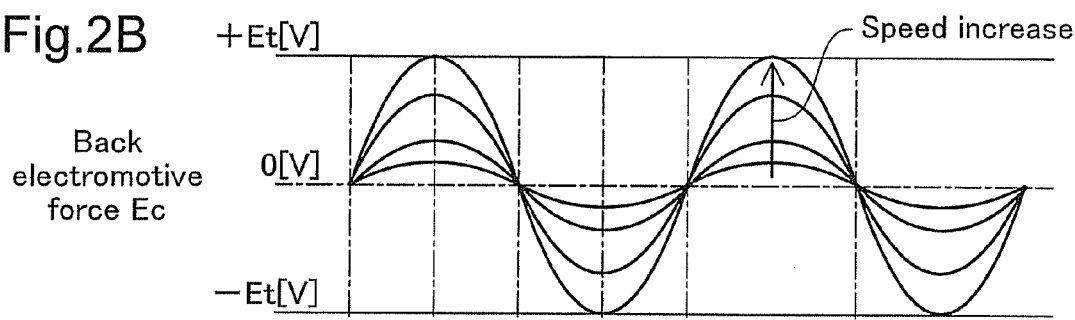
Figure 2C:
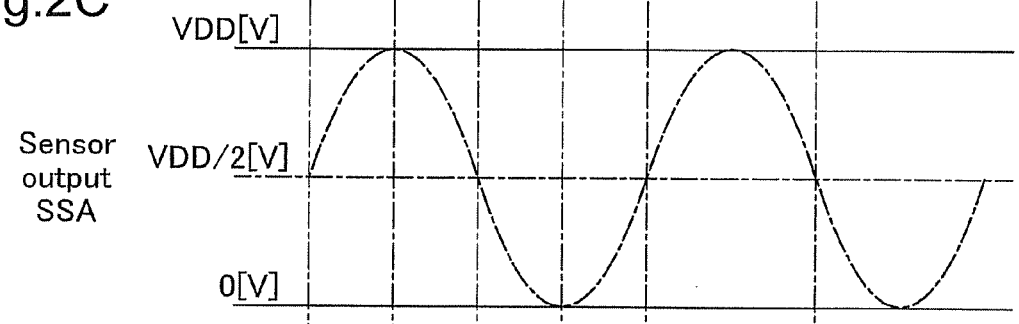
Figure 2D:
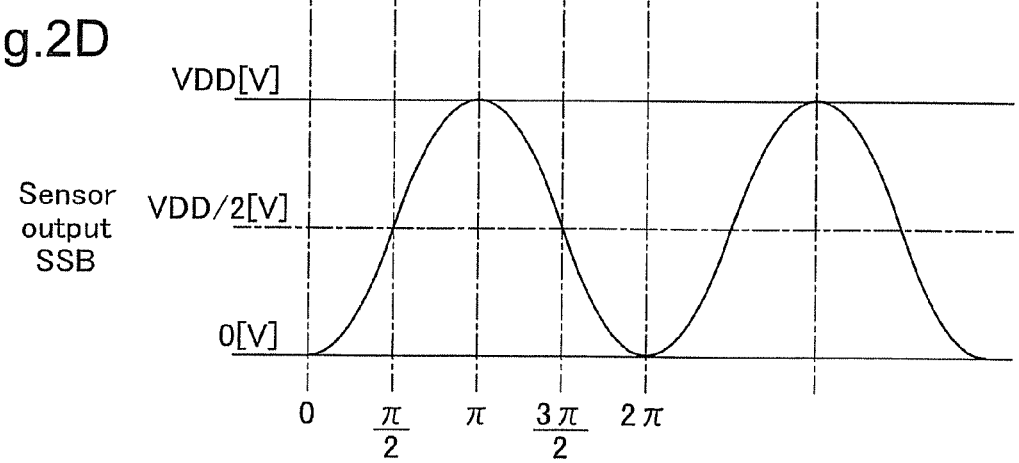

FIGS. 2A-2D illustrate the relationship of sensor output and back electromotive force waveform. FIG. 2A is identical to FIG. 1D. FIG. 2B shows an exemplary waveform of back electromotive force generated by the phase A coils 12A. FIGS. 2C and 2D show exemplary waveforms of sensor outputs SSA, SSB of the phase A sensor 40A and the phase B sensor 40B. These sensors 40A, 40B can generate sensor outputs SSA, SSB of shape substantially similar to the back electromotive force of the coils during motor operation. The back electromotive force of the coils 12A shown in FIG. 2B tends to rise together with motor speed but its waveform shape (sine wave) maintains substantially similar shape. Hall ICs that utilize the Hall effect, for example, could be employed as the sensors 40A, 40B. In this example, the sensor output SSA and the back electromotive force Ec are each a sine wave or waveform approximating a sine wave. As will be discussed later, the drive control circuit of this motor, utilizing the sensor outputs SSA, SSB, applies voltage of shape substantially similar to the back electromotive force Ec to the respective coils 12A, 12B.

An electric motor functions as an energy conversion device that converts between mechanical energy and electrical energy. The back electromagnetic force of the coils represents mechanical energy of the electric motor converted to electrical energy. Consequently, where electrical energy applied to the coils is converted to mechanical energy (that is, where the motor is driven), it is possible to drive the motor with maximum efficiency by applying voltage of similar waveform to the back electromagnetic force. As will be discussed below, "voltage of similar waveform to the back electromagnetic force" means voltage that generates current flowing in the opposite direction from the back electromagnetic force.

Figure 3A:
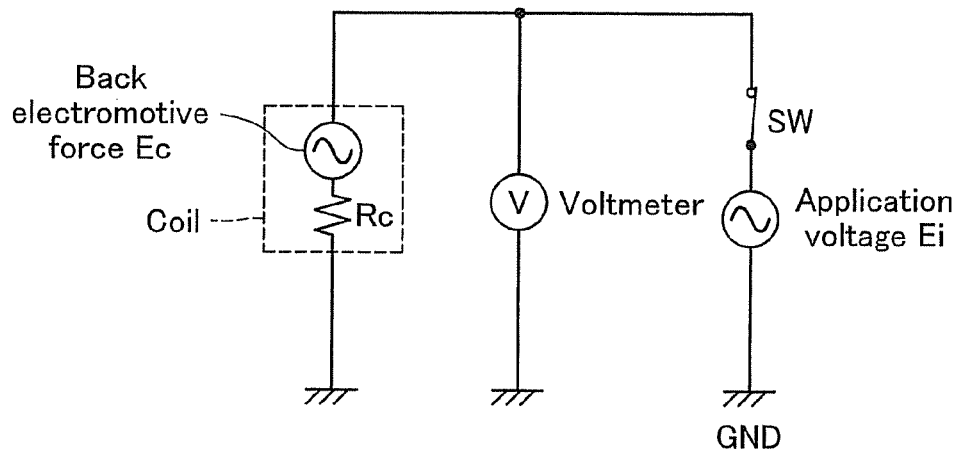
FIG. 3A is a model diagram illustrating the relationship of applied voltage and electromotive force of a coil.

FIG. 3A is a model diagram illustrating the relationship of applied voltage and electromotive force of a coil. Here, the coil is simulated in terms of AC back electromotive force Ec and resistance Rc. In this circuit, a voltmeter V is parallel-connected to the AC application voltage Ei and the coil. The back electromotive force Ec is also termed "induced voltage Ec" and the application voltage Ei is also termed "exciting voltage Ei." When AC voltage Ei is applied to the coil to drive the motor, back electromotive force Ec will be generated a direction of current flow opposite that of the application voltage Ei. When a switch SW is opened while the motor is rotating, the back electromotive force Ec can be measured with the voltmeter V. The polarity of the back electromotive force Ec measured with the switch SW open will be the same as the polarity of the application voltage Ei measured with the switch SW closed. The phrase "application of voltage of substantially similar waveform to the back electromagnetic force" herein refers to application of voltage having the same polarity as, and waveform of substantially similar shape to, the back electromotive force Ec measured by the voltmeter V.

Figure 3B:
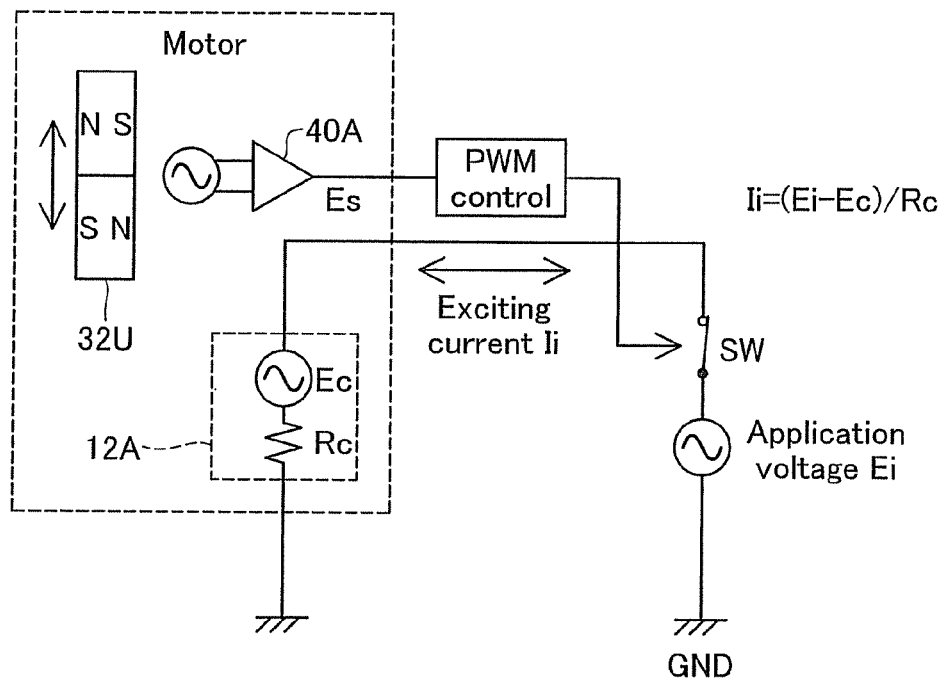
FIG. 3B illustrates an overview of the driving method employed in the present embodiment.

FIG. 3B illustrates an overview of the driving method employed in the present embodiment. Here, the motor is simulated by the phase A coils 12A, the permanent magnets 32U, and the phase A sensor 40A. When the rotor having the permanent magnets 32U turns, AC voltage Es (also termed "sensor voltage Es") is generated in the sensor 40A. This sensor voltage Es has a waveform shape substantially similar to that of the induced voltage Ec of the coil 12A. Thus, by generating PWM signal which simulates the sensor voltage Es for on/off control of the switch SW it will be possible to apply to the coils 12A exciting voltage Ei of substantially similar waveform to the induced voltage Ec. The exciting current Ii at this time will be given by Ii=(Ei−Ec)/Rc.

As noted previously, when driving a motor, it is possible to drive the motor with maximum efficiency through application of voltage of waveform similar to that of the back electromagnetic force. It can be appreciated that energy conversion efficiency will be relatively low in proximity to the midpoint (in proximity to 0 voltage) of the sine wave waveform of back electromotive force, while conversely energy conversion efficiency will be relatively high in proximity to the peak of the back electromotive force waveform. Where a motor is driven by applying voltage of waveform similar to that of the back electromotive force, relatively high voltage can be applied during periods of high energy conversion efficiency, thereby improving efficiency of the motor. On the other hand, if the motor is driven with a simple rectangular waveform for example, considerable voltage will be applied in proximity to the position where back electromotive force is substantially 0 (midpoint) so motor efficiency will drop. Also, when voltage is applied during such periods of low energy conversion efficiency, due to eddy current vibration will be produced in directions other than the direction of rotation, thereby creating a noise problem.

As will be understood from the preceding discussion, the advantages of driving a motor through application of voltage of similar waveform to the back electromotive force are improved motor efficiency and reduced vibration and noise.

Figure 4A:
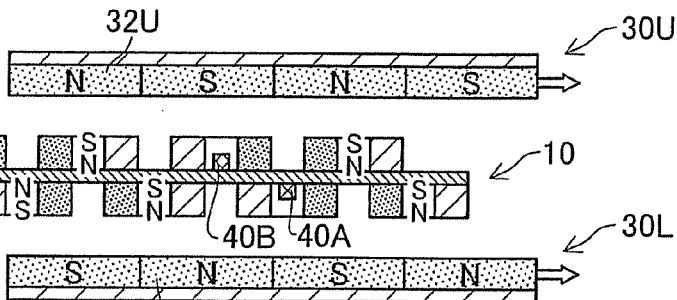
FIG. 4A-4D are illustrations depicting forward rotation operation of the brushless motor of the embodiment.
Figure 4B:
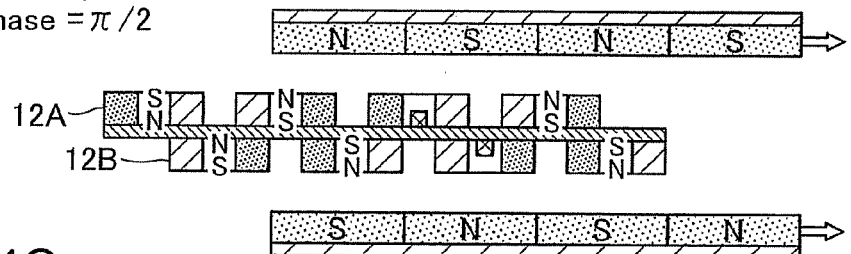
Figure 4C:
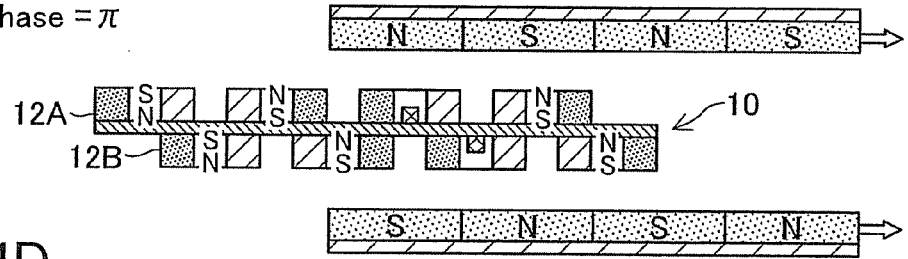
Figure 4D:
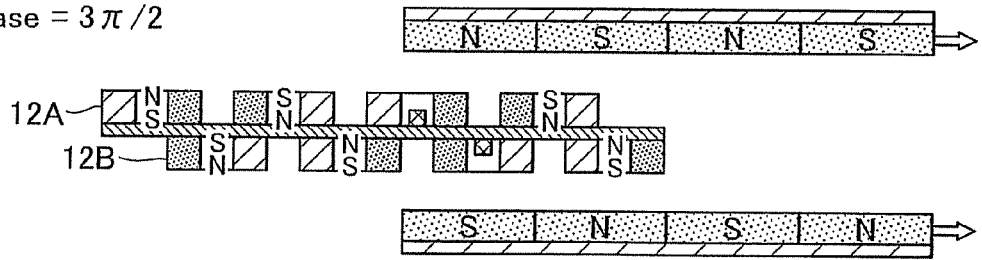
Figure 5A:
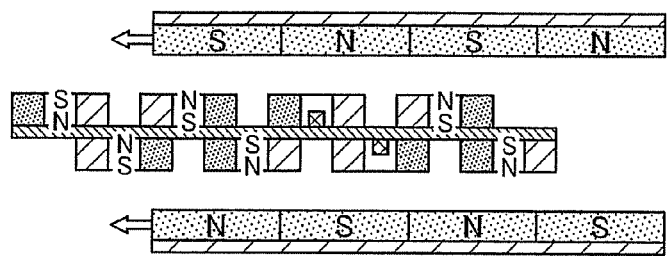
FIG. 5A-5D are illustrations depicting reverse rotation operation of the brushless motor of the embodiment.
Figure 5B:
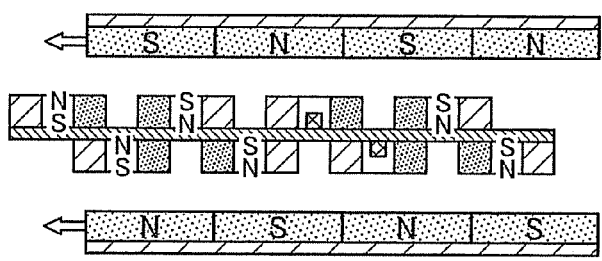
Figure 5C:
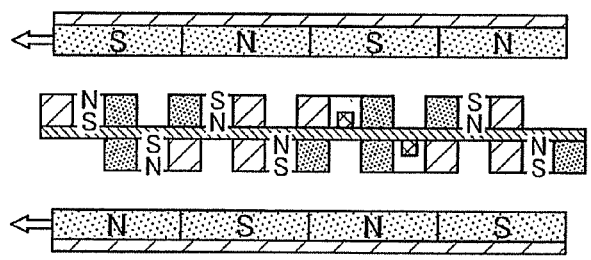
Figure 5D:
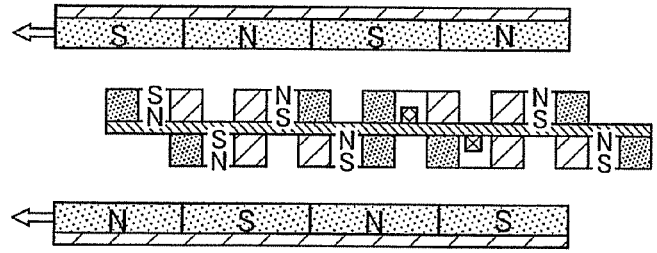

FIG. 4A-4D are illustrations depicting forward rotation operation of the brushless motor of the embodiment. FIG. 4A depicts the state just before the phase reaches 0. The letters "N" and "S" shown at locations of the phase A coils 12A and the phase B coils 12B indicate the excitation direction of these coils 12A, 12B. When the coils 12A, 12B are excited, forces of attraction and repulsion are generated between the coils 12A, 12B and the magnets 32U, 32L. As a result, the rotor portions 30U, 30L turn in the forward rotation direction (rightward in the drawing). At the timing of the phase going to 0, the excitation direction of the phase A coils 12A reverses (see FIGS. 2A-2D). FIG. 4B depicts a state where the phase has advanced to just before π/2. At the timing of the phase going to π/2, the excitation direction of the phase B coils 12B reverses. FIG. 4C depicts a state where the phase has advanced to just before π. At the timing of the phase going to π, the excitation direction of the phase A coils 12B again reverses. FIG. 4D depicts a state where the phase has advanced to just before 3π/2. At the timing of the phase going to 3π/2, the excitation direction of the phase B coils 12B again reverses.

As will be apparent from FIGS. 2C and 2D as well, at times at which the phase equals an integral multiple of π/2 the sensor outputs SSA, SSB will go to zero, and thus driving force will be generated from only one of the two sets of coils 12A, 12B. However, during all periods except for times at which the phase equals integral multiples of π/2, it will be possible for the sets of coils 12A, 12B of both phases to generate driving force. Consequently, high torque can be generated using the sets of coils 12A, 12B of both phases.

As will be apparent from FIG. 4A, the phase A sensor 40A is positioned such that the location at which the polarity of its sensor output switches will be situated at a location where the center of a phase A coil 12A faces the center of a permanent magnet 32U. Similarly, the phase B sensor 40B is positioned such that the location at which the polarity of the sensor output switches will be situated at a location where the center of a phase B coil 12A faces the center of a permanent magnet 32L. By positioning the sensors 40A, 40B at these locations, it will be possible to generate from the sensors 40A, 40B the sensor outputs SSA, SSB (FIGS. 2C and 2D) which have substantially similar waveform to the back electromotive force of the coils.

FIG. 5A-5D are illustrations depicting reverse rotation operation of the brushless motor of the embodiment. FIG. 5A-5D respectively depicts states where the phase has reached just before 0, π/2, π, and 3/π2. Reverse rotation operation can be accomplished, for example, by reversing the polarity of the drive voltages of the coils 12A, 12B to from that of the respective drive voltages during forward rotation operation.

A2. Configuration of Drive Circuit Unit

Figure 6:
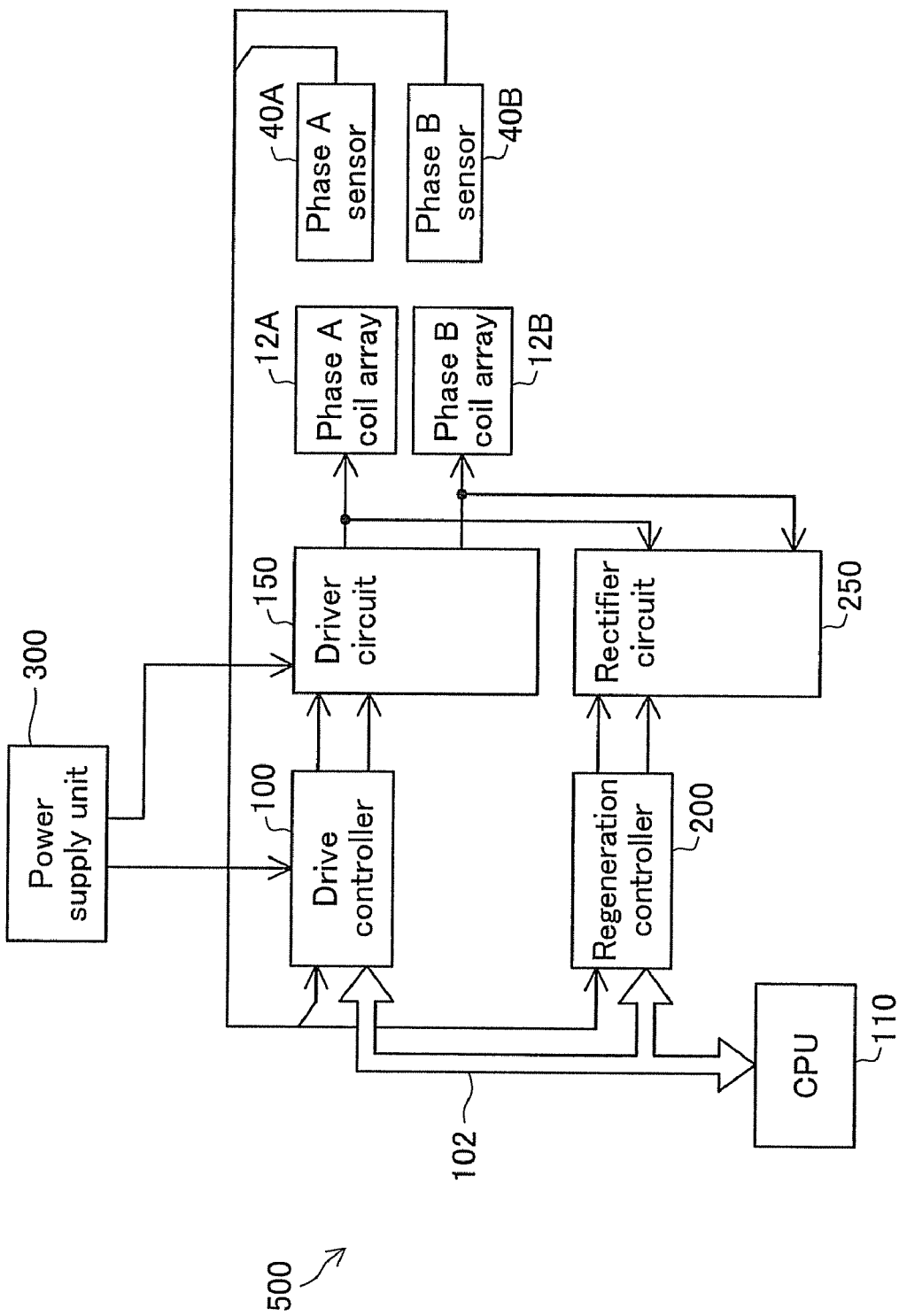
FIG. 6 is a block diagram depicting an internal configuration of a drive circuit unit in the present embodiment.

FIG. 6 is a block diagram depicting an internal configuration of a drive circuit unit in the present embodiment. The drive circuit unit 500 has a CPU 110, a drive controller 100, a regeneration controller 200, a driver circuit 150, a rectifier circuit 250, and a power supply unit 300. The two controllers 100, 200 are connected to the CPU 110 via a bus 102. The drive controller 100 and the driver circuit 150 are circuits for carrying out control in instances where driving force is to be generated in the electric motor. The regeneration controller 200 and the rectifier circuit 250 are circuits for carrying out control in instances where power from the electric motor is to be regenerated. The regeneration controller 200 and the rectifier circuit 250 will be referred to collectively as a "regeneration circuit." The drive controller 100 will also be referred to as a "drive signal generating circuit." The power supply unit 300 is a circuit for supplying various power supply voltages to other circuits in the drive circuit unit 500. In FIG. 6, for convenience, only the power lines going from the power supply unit 300 to the drive controller 100 and the driver circuit 150 are shown; power lines leading to other circuits have been omitted.

FIG. 7 shows a configuration of a phase A driver circuit 120A and a phase B driver circuit 120B included in the driver circuit 150 (FIG. 6). The phase A driver circuit 120A is an H bridge circuit for delivering AC drive signals DRVA1, DRVA2 to the phase A coils 12A. The white circles next to terminal portions of blocks which indicate drive signals denote negative logic and indicate that the signal is inverted.

The arrows labeled IA1, IA2 respectively indicate the direction of current flow with the A1 drive signal DRVA1 and the A2 drive signal DRVA2. The configuration of the phase B driver circuit 120B is the same as the configuration of the phase A driver circuit 120A.

Figure 8A:
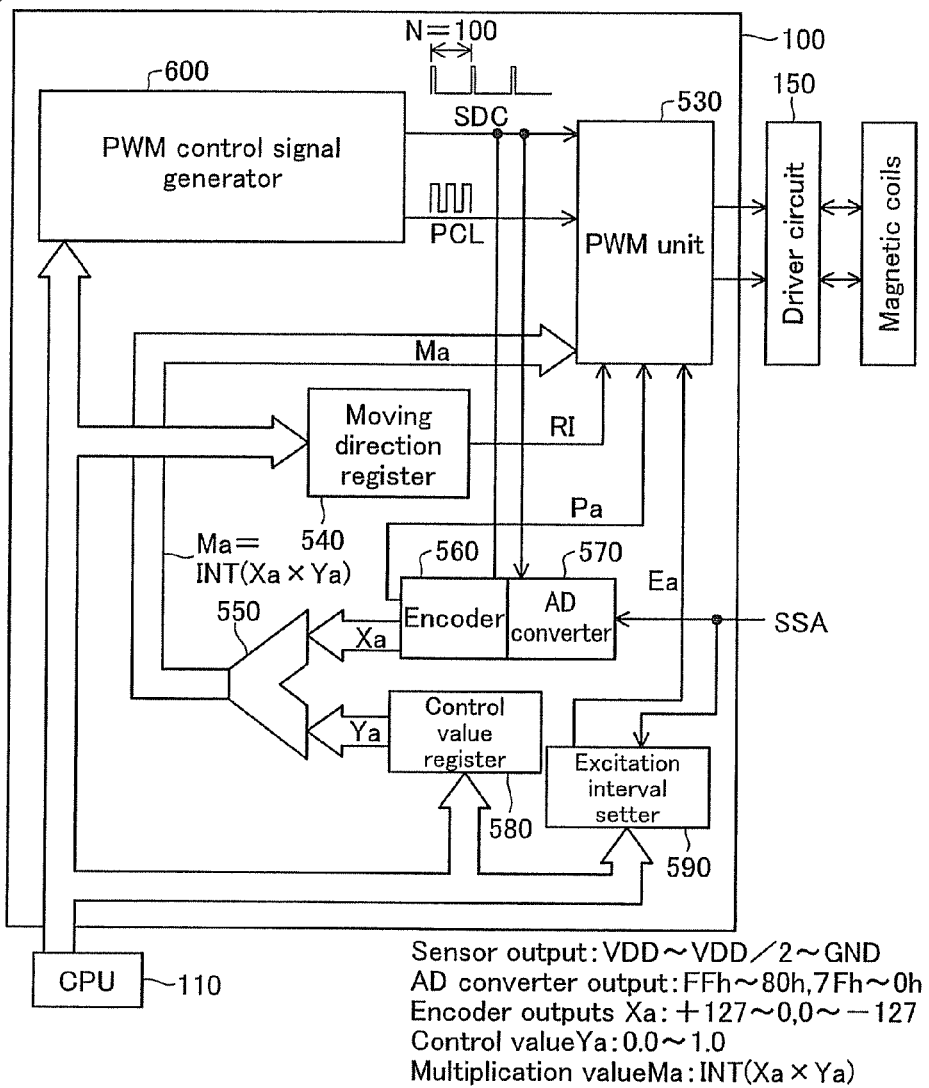
FIG. 8A-8E are explanatory views showing the internal configuration and the operations of the drive controller 100.
Figure 8B:
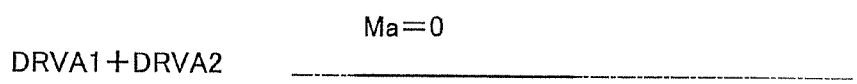
Figure 8C:
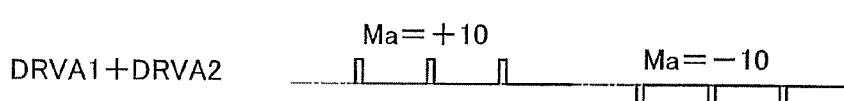
Figure 8D:
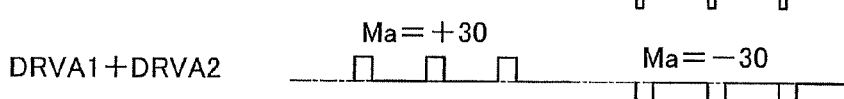
Figure 8E:
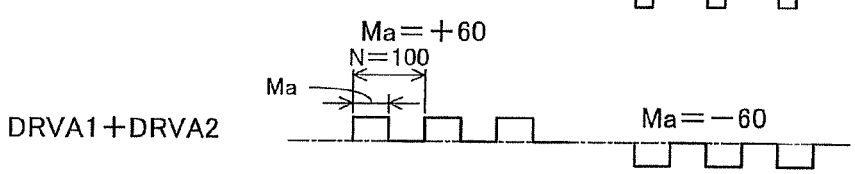

FIG. 8A-8E are explanatory views showing the internal configuration and the operations of the drive controller 100 (FIG. 6). The drive controller 100 includes a PWM control signal generator 600, PWM units 530, a moving direction register 540, multipliers 550, encoders 560, AD converters 570, voltage control value registers 580, and excitation interval setters 590. The drive controller 100 is a circuit configured to generate both a driving signal for the phase A and a driving signal for the phase B. The PWM control signal generator 600 and the moving direction register 540 are commonly used for the phase A and the phase B. The other components of the drive controller 100 are provided individually for the phase A and the phase B. While only the components for the phase A are shown in FIG. 8A as a matter of convenience, another set of the same components are provided for the phase B in the drive controller 100.

The PWM control signal generator 600 generates a clock signal SDC having a preset frequency and a clock signal PCL having a frequency of N times as much as the frequency of the clock signal SDC. The value N is set in advance by the CPU 110. The internal structure of the PWM control signal generator 600 will be explained later. The PWM unit 530 generates AC drive signals DRVA1 and DRVA2 (FIG. 7), based on the clock signals PCL and SDC, a multiplication result Ma output from the multiplier 550, a forward/reverse directional value RI output from the moving direction register 540, a positive/negative sign signal Pa output from the encoder 560, and an excitation interval signal Ea output from the excitation interval setter 590. The operations of these components will be described later.

A value RI indicating the direction for motor rotation is established in the moving direction register 540, by the CPU 110. In the present embodiment, the motor will rotate forward when the forward/reverse direction value RI is L level, and rotate in reverse rotation when H level. The other signals Ma, Pa, Ea supplied to the PWM unit 530 are determined as follows.

The output SSA of the magnetic sensor 40 is supplied to the AD converter 570. This sensor output SSA has a range, for example, of from GND (ground potential) to VDD (power supply voltage), with the middle point thereof (=VDD/2) being the π phase point of the output waveform, or the point at which the sine wave passes through the origin. The AD converter 570 performs AD conversion of this sensor output SSA to generate a digital value of sensor output. The output of the AD converter 570 has a range, for example, of FFh to 0h (the "h" suffix denotes hexadecimal), with the median value of 80h corresponding to the middle point of the sensor waveform.

The encoder 560 converts the range of the sensor output value subsequent to the AD conversion, and sets the value of the middle point of the sensor output value to 0. As a result, the sensor output value Xa generated by the encoder 560 assumes a prescribed range on the positive side (e.g. between +127 and 0) and a prescribed range on the negative side (e.g. between 0 and −127). However, the value supplied to the multiplier 560 by the encoder 560 is the absolute value of the sensor output value Xa; the positive/negative sign thereof is supplied to the PWM unit 530 as the positive/negative sign signal Pa.

The voltage control value register 580 stores a voltage control value Ya established by the CPU 110. This voltage control value Ya, together with the excitation interval signal Ea discussed later, functions as a value for setting the application voltage to the motor. The value Ya can assume a value between 0 and 1.0, for example. Assuming an instance where the excitation interval signal Ea has been set with no non-excitation intervals provided so that all of the intervals are excitation intervals, Ya=0 will mean that the application voltage is zero, and Ya=1.0 will mean that the application voltage is at maximum value. The multiplier 550 performs multiplication of the voltage control value Ya and the sensor output value Xa output from the encoder 560 and conversion to an integer; the multiplication value Ma thereof is supplied to the PWM unit 530.

FIGS. 8B-8E depict operation of the PWM unit 530 in instances where the multiplication value Ma takes various different values. Here, it is assumed that there are no non-excitation intervals, so that all intervals are excitation intervals. The PWM unit 530 is a circuit that, during one period of the clock signal SDC, generates one pulse with a duty factor of Ma/N. Specifically, as shown in FIGS. 8B-8E, the pulse duty factor of the single-phase drive signals DRVA1, DRVA2 increases in association with increase of the multiplication value Ma. The first drive signal DRVA1 is a signal that generates a pulse only when the sensor output SSA is positive and the second drive signal DRVA2 is a signal that generates a pulse only when the sensor output SSA is negative; in FIGS. 8B-8E, both are shown together. For convenience, the second drive signal DRVA2 is shown in the form of pulses on the negative side.

Figure 9:
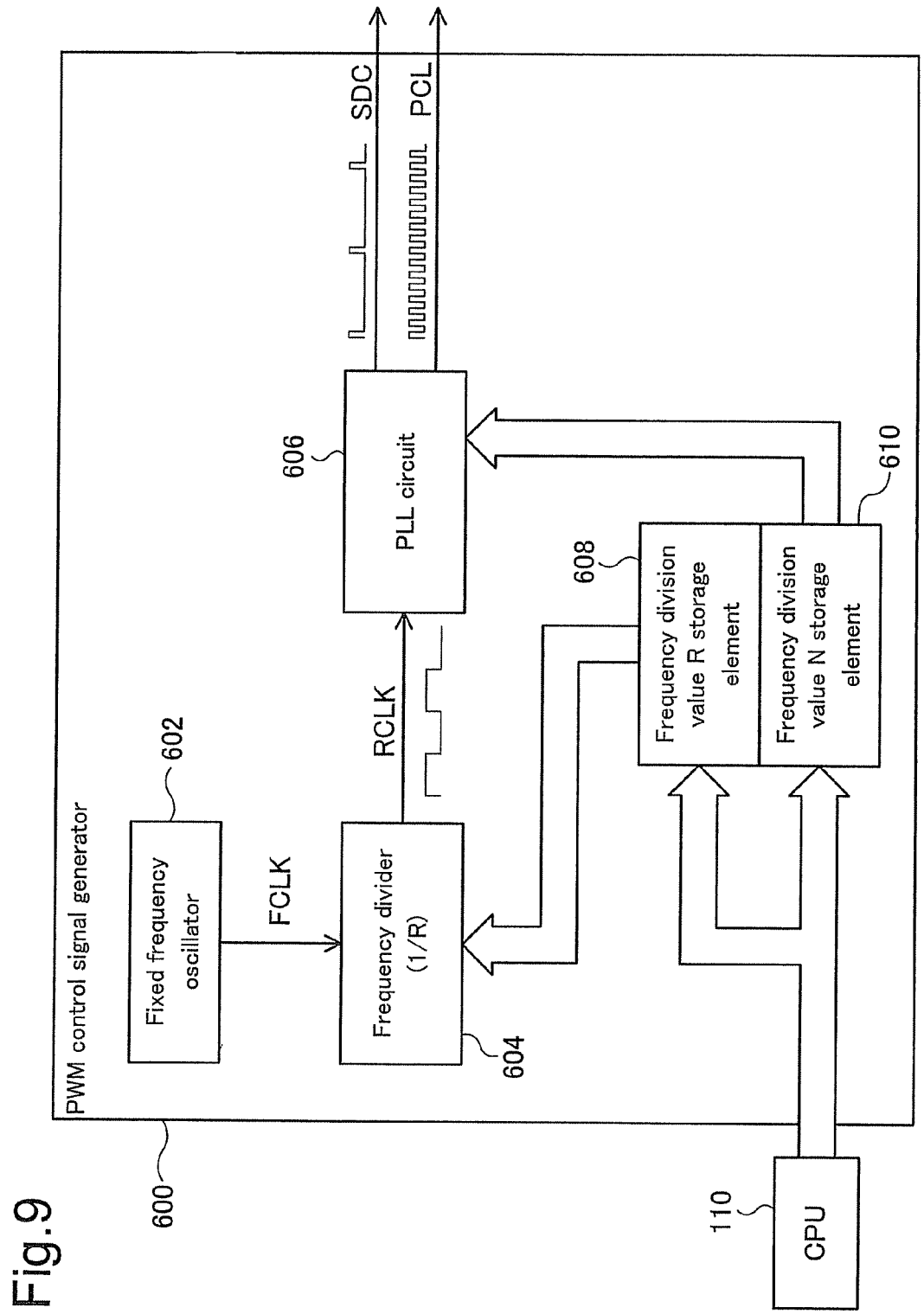
FIG. 9 is a block diagram showing the internal structure of the PWM control signal generator 600.

FIG. 9 is a block diagram showing the internal structure of the PWM control signal generator 600. The PWM control signal generator 600 includes a fixed frequency oscillator 602, a frequency divider 604, a PLL circuit 606, a frequency division value R storage element 608, and a frequency division value N storage element 610. The fixed frequency oscillator 602 is a circuit generating a fixed clock signal FCLK of a fixed frequency and may be constructed by, for example, a crystal oscillator or a ceramic oscillator. The frequency divider 604 divides the frequency of the fixed clock signal FLCK to 1/R and outputs a frequency-divided clock signal RCLK. The PLL circuit 606 generates the clock signal SDC in synchronism with the frequency-divided clock signal RCLK and the clock signal PCL having the frequency of N times as much as the frequency of the clock signal SDC. The value 'N times' represents a frequency division value N of a frequency divider provided in the PLL circuit 606 as explained later. The frequency division value N is stored in the frequency division value N storage element 610 and is arbitrarily rewritable by the CPU 110. Similarly a frequency division value R is stored in the frequency division value R storage element 608 and is arbitrarily rewritable by the CPU 110.

Figure 10:
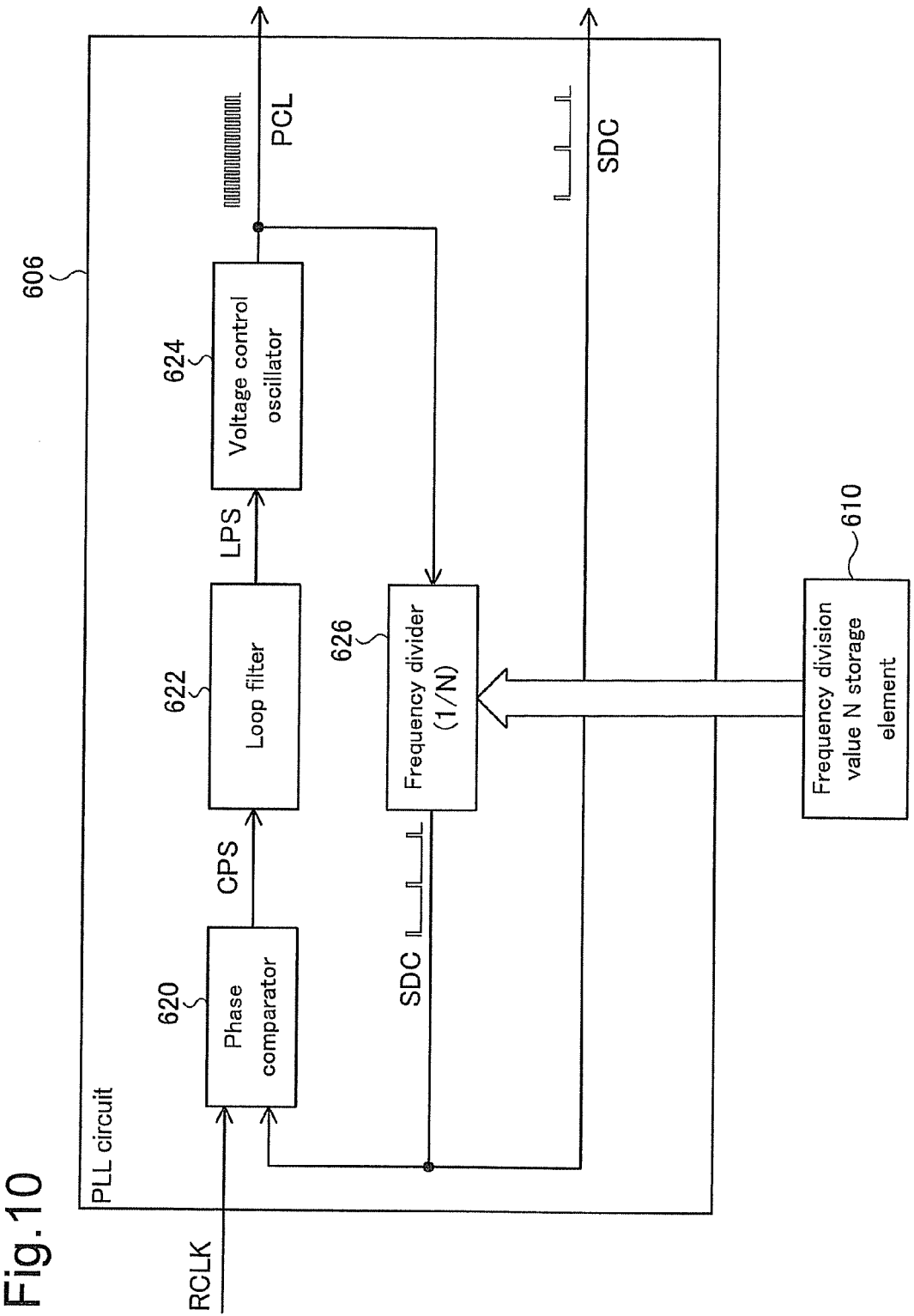
FIG. 10 is a block diagram showing the internal structure of the PLL circuit 606.

FIG. 10 is a block diagram showing the internal structure of the PLL circuit 606. The PLL circuit 606 includes a phase comparator 620, a loop filter 622, a voltage control oscillator 624, and a frequency divider 626. The frequency-divided clock signal RCLK output from the frequency divider 604 (FIG. 9) is input into the phase comparator 620 as a reference signal. The clock signal SDC output after frequency division by the frequency divider 626 is input into the phase comparator 620 as a return signal. The phase comparator 620 generates an error signal CPS representing a phase difference between the two input signals RCLK and SDC. The error signal CPS is sent to the loop filter 622 including a charge pump circuit. The charge pump circuit included in the loop filter 622 generates and outputs a voltage control signal LPS having a voltage level corresponding to a pulse level and a pulse number of the error signal CPS.

The voltage control oscillator 624 outputs the clock signal PCL having an oscillation frequency corresponding to the voltage level of the voltage control signal LPS. The clock signal PCL is subjected to frequency division to 1/N by the frequency divider 626, based on the frequency division value N stored in the frequency division value N storage element 610. The clock signal SDC output from the frequency divider 626 is input into the phase comparator 620 to be subjected to phase comparison with the frequency-divided clock signal RCLK as explained previously. The frequency of the clock signal PCL is converged to decrease the phase difference between the two input signals RCLK and SDC to zero. A frequency fPCL of the converged clock signal PCL is equal to the product of a frequency fRCLK of the frequency-divided clock signal RCLK and the frequency division value N. The frequency fPCL of the converged clock signal PCL is also equal to the product of a frequency fSDC of the clock signal SDC and the frequency division value N.

There are the following relations between a frequency fFCLK of the fixed clock signal FCLK, the frequency fRCLK of the frequency-divided clock signal, the frequency fSDC of the clock signal SDC, and the frequency fPCL of the clock signal PCL.

$$fFCLK/R=fRCLK \quad (1)$$

$$fRCLK=fSDC \quad (2)$$

$$fSDC \times N=fPCL \quad (3)$$

In the above structure, rewriting the frequency division value N changes only the frequency of the clock signal PCL, while keeping the frequency of the clock signal SDC unchanged. Increasing the frequency of the clock signal PCL with the unchanged frequency of the clock signal SDC allows the duty cycle to be set more finely. The frequency of the clock signal SDC should be set in advance not to coincide with resonance frequency of a load structure, such as a motor main body. Such setting effectively prevents the occurrence of vibration or noise from the load structure like the motor main body in the state of changing the frequency of the clock signal PCL. The frequency of the clock signal SDC is set preferably out of an audio frequency range.

Rewriting the frequency division value R stored in the frequency division value R storage element 608 (FIG. 9) changes the frequency of the frequency-divided clock signal RCLK and the frequency of the clock signal SDC. Increasing the frequency of the clock signal SDC ensures PWM control at cycles of narrower time intervals and thereby allows control with high precision (for example, attitude control). In this state, the relation of Equation (3) given above is held as the relation between the frequency fSDC of the clock signal SDC and the frequency fPCL of the clock signal PCL. As mentioned above, it is preferable to change the frequency of the clock signal SDC in such a manner that the frequency of the clock signal SDC does not coincide with the resonance frequency of the load structure.

FIGS. 11A and 11B are timing charts showing the operations of the fixed clock signal FLCK, the frequency-divided clock signal RCLK, the clock signal SDC, and the clock signal PCL. FIG. 11A shows the operations of these signals at the frequency division value N equal to 7. In this case, seven pulses of the clock signal PCL are generated in one period of the clock signal SDC. At the frequency division value N equal to 14, fourteen pulses of the clock signal PCL are generated in one period of the clock signal SDC as shown in FIG. 11B.

FIGS. 12A-12C depict correspondence between sensor output waveform and waveform of the drive signals generated by the PWM unit 530. In the drawing, "Hiz" denotes a state of high impedance where the magnetic coils are not excited. As described in FIGS. 8B-9E, the single-phase drive signals DRVA1, DRVA2 are generated by PWM control using the analog waveform of the sensor output SSA. Consequently, using these single-phase drive signals DRVA1, DRVA2 it is possible to supply to the coils effective voltage that exhibits changes in level corresponding to change in the sensor outputs SSA.

The PWM unit 530 is constructed such that drive signals are output only during the excitation intervals indicated by the excitation interval signal Ea supplied by the excitation interval setting unit 590, with no drive signals being output at intervals except for the excitation intervals (non-excitation intervals). FIG. 12C depicts drive signal waveforms produced in the case where excitation intervals EP and non-excitation intervals NEP have been established by the excitation interval signal Ea. During the excitation intervals EP, the drive signal pulses of FIG. 12B are generated as is; during the non-excitation intervals NEP, no pulses are generated. By establishing excitation intervals EP and non-excitation intervals NEP in this way, voltage will not be applied to the coils in proximity to the middle point of the back electromotive force waveform (i.e. in proximity to the middle point of the sensor output), thus making possible further improvement of motor efficiency. Preferably the excitation intervals EP will be established at intervals symmetric about the peak point of the back electromotive force waveform; and preferably the non-excitation intervals NEP will be established in intervals symmetric about the middle point (center) of the back electromotive force waveform.

As discussed previously, if the voltage control value Ya is set to a value less than 1, the multiplication value Ma will be decreased in proportion to the voltage control value Ya. Consequently, effective adjustment of application voltage is possible by the voltage control value Ya as well.

As will be understood from the preceding description, with the motor of the present embodiment, it is possible to adjust the application voltage using both the voltage control value Ya and the excitation interval signal Ea. In preferred practice, relationships between desired application voltage on the one hand, and the voltage control value Ya and excitation interval signal Ea on the other, will be stored in advance in table format in memory in the drive circuit unit 500 (FIG. 6). By so doing, when the drive circuit unit 500 has received a target value for the desired application voltage from the outside, it will be possible for the CPU 110, in response to the target value, to set the voltage control value Ya and the excitation interval signal Ea in the drive controller 100. Adjustment of application voltage does not require the use of both the voltage control value Ya and the excitation interval signal Ea, and it would be acceptable to use either one of them instead.

Figure 13:
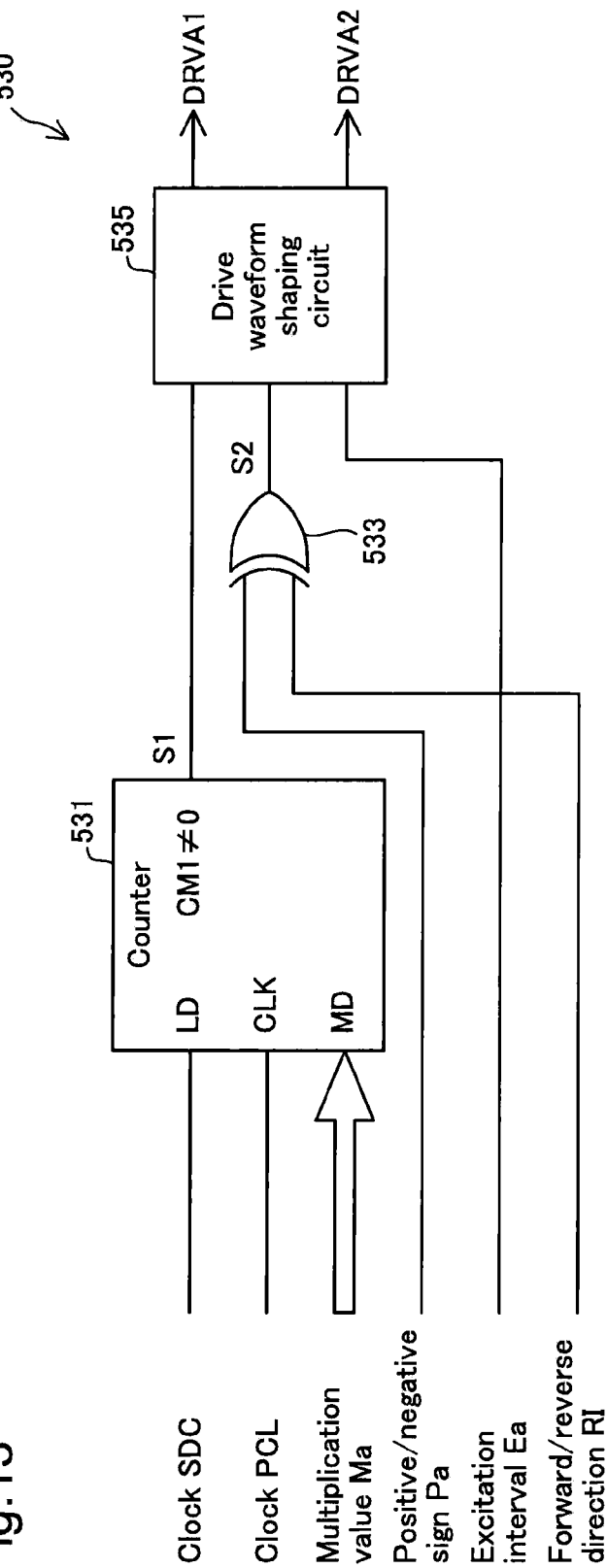
FIG. 13 is a block diagram depicting the internal configuration of the PWM unit 530.

FIG. 13 is a block diagram depicting the internal configuration of the PWM unit 530 (FIG. 8A). The PWM unit 530 has a counter 531, an EXOR circuit 533, and a drive waveform shaping circuit 535. Their operation will be described below.

Figure 14:
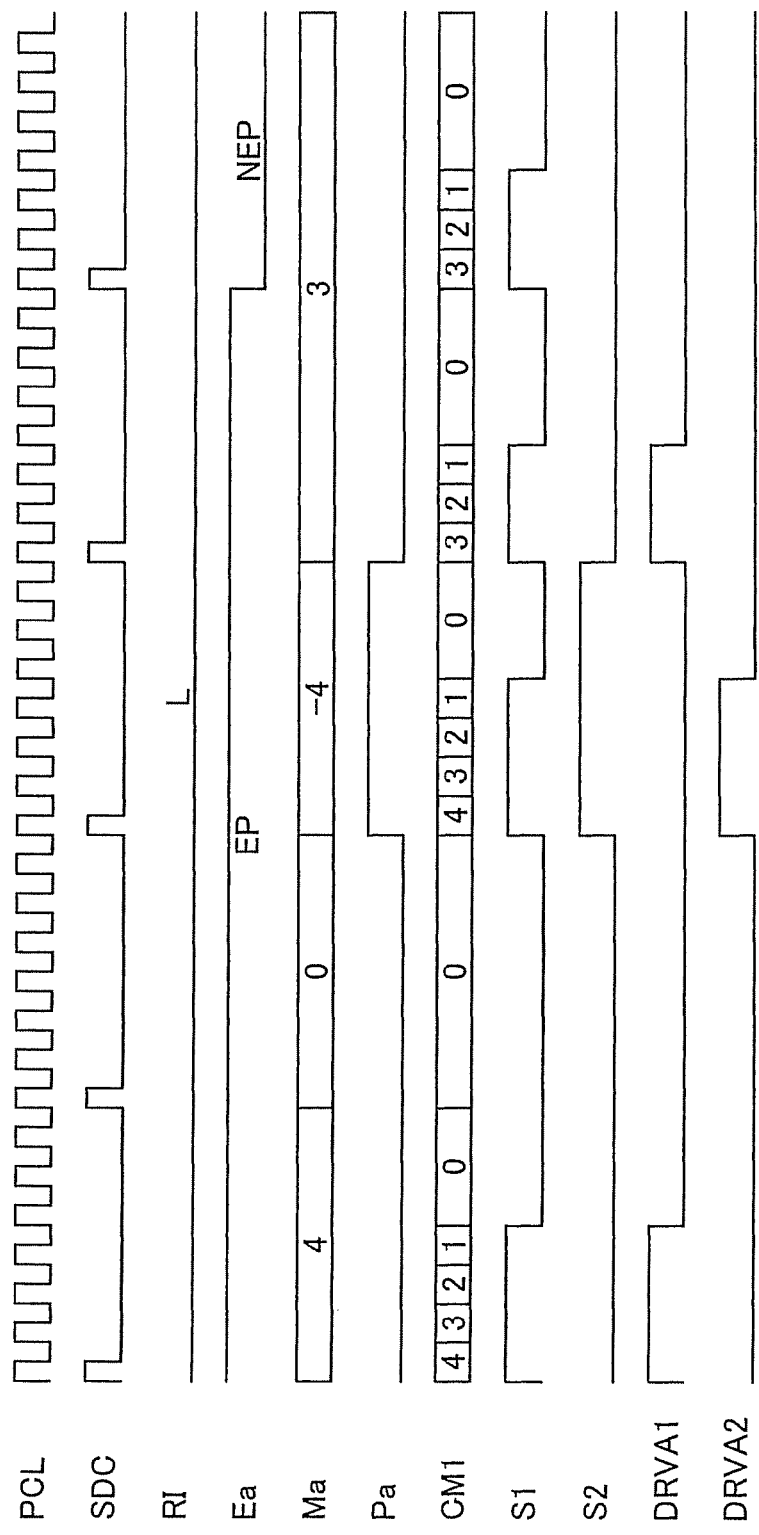
FIG. 14 is a timing chart depicting operation of the PWM unit 530 during forward rotation of the motor.

FIG. 14 is a timing chart depicting operation of the PWM unit 530 during forward rotation of the motor. The drawing show the two clock signals PCL and SDC, the forward/reverse direction value RI, the excitation interval signal Ea, the multiplication value Ma, the positive/negative sign signal Pa, the counter value CM1 in the counter 531, the output SI of the counter 531, the output S2 of the EXOR circuit 533, and the output signals DRVA1, DRVA2 of the drive waveform shaping circuit 535. For each one cycle of the clock signal SDC, the counter 531 repeats an operation of decrementing the count value CM1 to 0, in sync with the clock signal PCL. The initial value of the count value CM1 is set to the multiplication value Ma. In FIG. 14, for convenience in illustration, negative multiplication values Ma are shown as well; however, the counter 531 uses the absolute values |Ma| thereof. The output S1 of the counter 531 is set to H level when the count value CM1 is not 0, and drops to L level when the count value CM1 is 0.

The EXOR circuit 533 outputs a signal S2 that represents the exclusive OR of the positive/negative sign signal Pa and the forward/reverse direction value RI. Where the motor is rotating forward, the forward/reverse direction value RI will be at L level. Consequently, the output S2 of the EXOR circuit 533 will be a signal identical to the positive/negative sign signal Pa. The drive waveform shaping circuit 535 generates the drive signals DRVA1, DRVA2 from the output S1 of the counter 531 and the output S2 of the EXOR circuit 533. Specifically, in the output S1 of the counter 531, the signal during intervals in which the output S2 of the EXOR circuit 533 is at L level will be output as the drive signal DRVA1, and the signal during intervals in which the output S2 of the EXOR circuit 533 is at H level will be output as the drive signal DRVA2. In proximity to the right edge in FIG. 14, the excitation interval signal Ea falls to L level thereby establishing a non-excitation interval NEP. Consequently, neither of the drive signals DRVA1, DRVA2 will be output during this non-excitation interval NEP, and a state of high impedance will be maintained.

FIG. 15 is a timing chart depicting operation of the PWM unit 530 during reverse rotation of the motor. Where the motor is rotating in reverse, the forward/reverse direction value RI will be at H level. As a result, the two drive signals DRVA1, DRVA2 switch relative to FIG. 12, and it will be appreciated that the motor runs in reverse as a result.

Figure 16A:
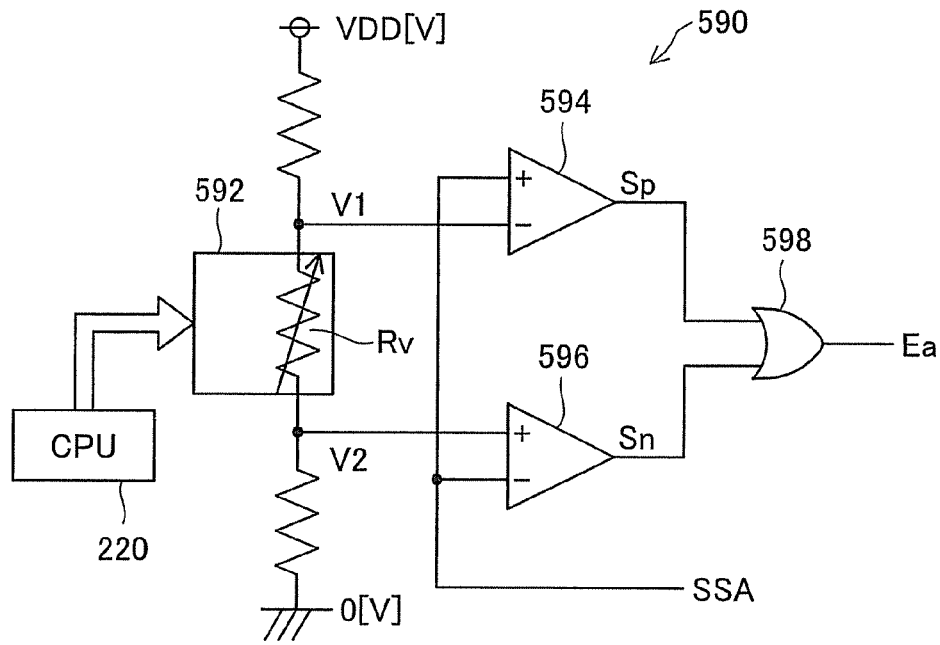
FIGS. 16A and 16B illustrate the internal configuration and operation of an excitation interval setting unit 590.
Figure 16B:
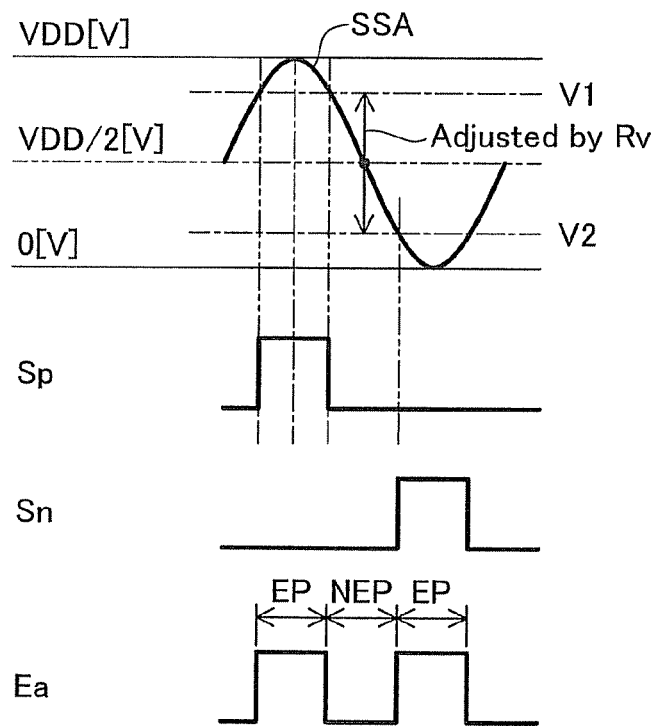

FIGS. 16A and 16B illustrate the internal configuration and operation of an excitation interval setting unit 590. The excitation interval setting unit 590 has an electronic variable resistor 592, a voltage comparators 594, 596, and an OR circuit 598. The resistance Rv of the electronic variable resistor 592 is set by the CPU 110. The voltages V1, V2 at either terminal of the electronic variable resistor 592 are supplied to one of the input terminals of the voltage comparators 594, 596. The sensor output SSA is supplied to the other input terminal of the voltage comparators 594, 596. The output signals Sp, Sn of the voltage comparators 594, 596 are input to the OR circuit 598. The output of the OR circuit 598 is the excitation interval signal Ea, which is used to differentiate excitation intervals and non-excitation intervals.

FIG. 16B depicts operation of the excitation interval setting unit 590. The voltages V1, V2 at the terminals of the electronic variable resistor 592 are modified by adjusting the resistance Rv. Specifically, the terminal voltages V1, V2 are set to values of equal difference from the median value of the voltage range (=VDD/2). In the event that the sensor output SSA is higher than the first voltage V1, the output Sp of the first voltage comparator 594 goes to H level, whereas in the event that the sensor output SSA is lower than the second voltage V2, the output Sn of the second voltage comparator 596 goes to H level. The excitation interval signal Ea is a signal derived by taking the logical sum of the these output signals Sp, Sn. Consequently, as shown at bottom in FIG. 16B, the excitation interval signal Ea can be used as a signal indicating excitation intervals EP and non-excitation intervals NEP. The excitation intervals EP and non-excitation intervals NEP are established by the CPU 110, by adjusting the variable resistance Rv.

Figure 17A:
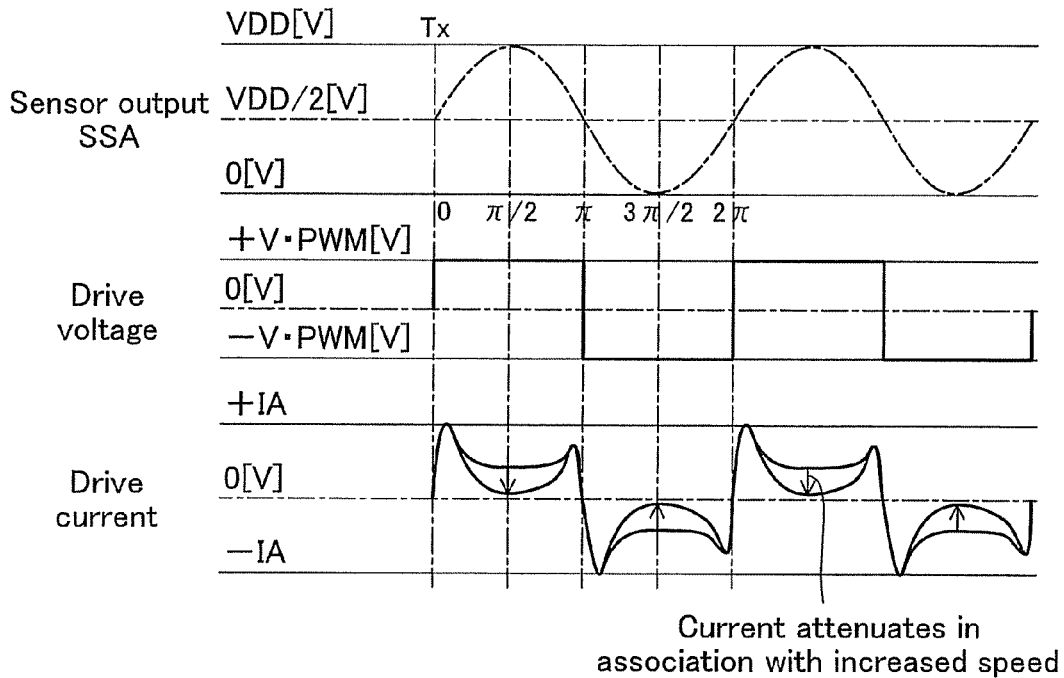
FIGS. 17A and 17B are illustrations comparing various signal waveforms in the case where the motor is driven by a rectangular wave, and where driven by a sine wave.
Figure 17B:
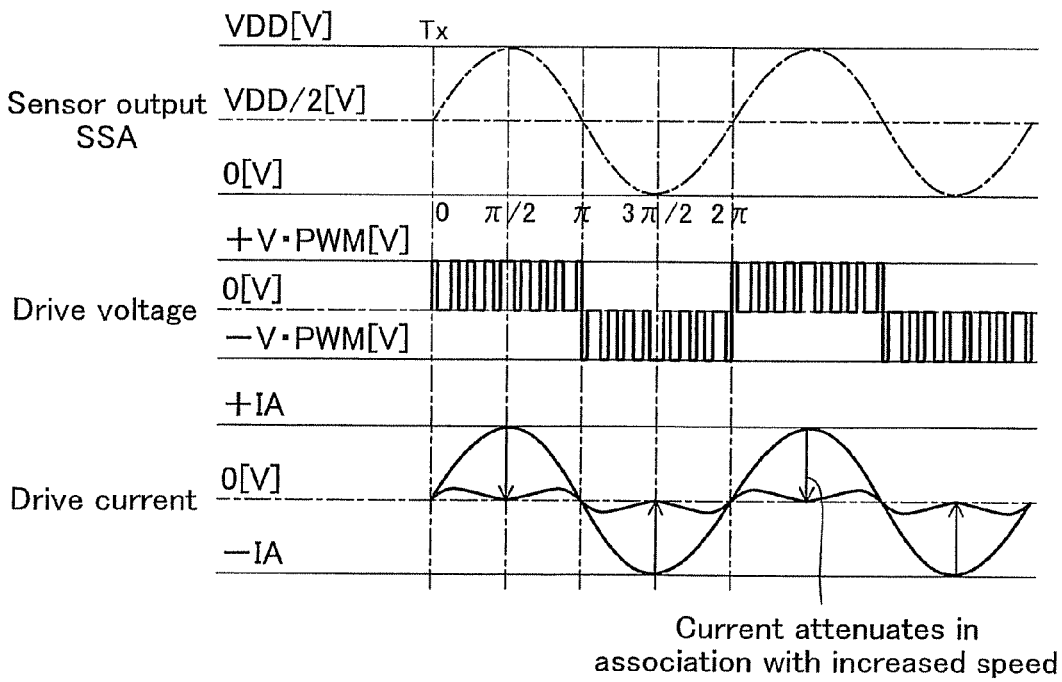

FIGS. 17A and 17B are illustrations comparing various signal waveforms in the case where the motor of the embodiment discussed above is driven by a rectangular wave, and where driven by a sine wave. Where a rectangular wave is employed for driving, a drive voltage of rectangular wave shape is applied to the coils. While the drive current is close to a rectangular wave at startup, it decreases as rotation speed increases. This is because the back electromotive force increases in response to the increased rotation speed (FIG. 2B). With a rectangular wave, however, despite increased rotation speed the current value will not decline appreciably in proximity to the timing of switching of the drive voltage at phase=nπ, so a fairly large current will tend to flow.

On the other hand, where a sine wave is employed for driving, PWM control is employed for the drive voltage so that the effective values of the drive voltage have sine wave shape. While the drive current is close to a sine wave at startup, as rotation speed increases the drive current will decrease due to the effects of back electromotive force. With sine wave driving, the current value declines appreciably in proximity to the timing of switching of the drive voltage polarity at phase=nπ. As discussed in the context of FIGS. 2A-2C, generally speaking the energy conversion efficiency of a motor is low in proximity to the timing of switching of the drive voltage polarity. With sine wave driving, the current value during intervals of low efficiency is lower than with rectangular wave, making it possible to drive the motor more efficiently.

FIG. 18 depicts another configuration example of the phase A driver circuit 120A and the phase B driver circuit 120B included in the driver circuit 150 (FIG. 6). These driver circuits 120A, 120B are furnished with amplifier circuits 122 situated in front of the gate electrodes of the transistors which make up the driver circuits 120A, 120B shown in FIG. 8. While the type of transistor also differs from that in FIG. 8, transistors of any type can be used as the transistors. In order to be able to drive the motor of the present invention over a wider operating range with regard to torque and speed, it will be preferable to establish variable power supply voltage VDD of the driver circuits 120A, 120B. Where the power supply voltage VDD has been changed, the level of the drive signals DRVA1, DRVA2, DRVB1, DRVB2 applied to the gate voltages of the transistors will change proportionally therewith. By so doing the motor can be driven using a wider power supply voltage VDD range. The amplifier circuits 122 are circuits for changing the level of the drive signals DRVA1, DRVA2, DRVB1, DRVB2. In preferred practice the power supply unit 300 of the drive circuit unit 500 shown in FIG. 6 will supply variable power supply voltage VDD to the driver circuit 150.

Figure 19:
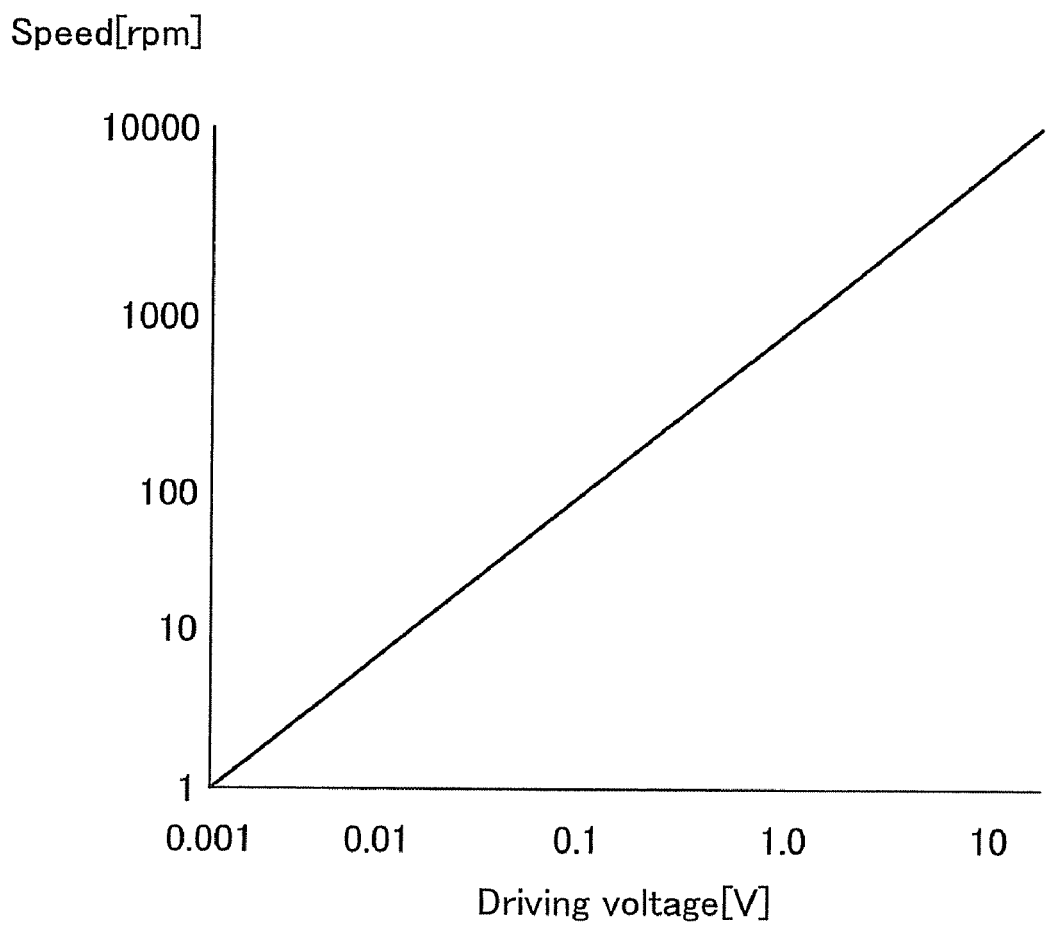
FIG. 19 shows the speed of the motor of the embodiment in the absence of load.

FIG. 19 shows the speed of the motor of the embodiment in the absence of load. As will be apparent from the graph, in the absence of load the motor of the embodiment will rotate at stable speed down to very low speed. The reason is that since there is no magnetic core, cogging does not occur.

Figure 20:
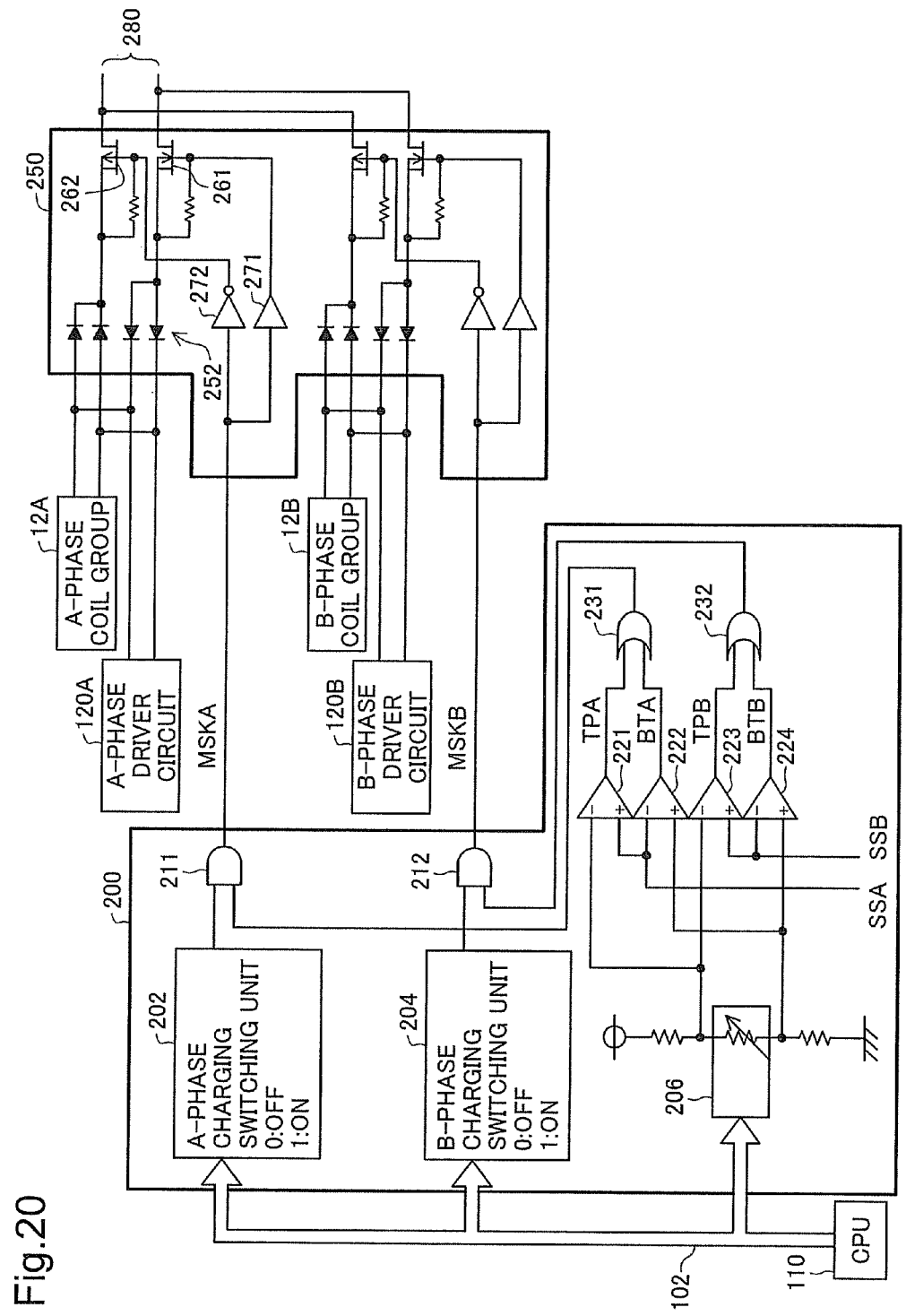
FIG. 20 illustrates the internal configuration of the regeneration controller 200 and rectifier circuit 250.

FIG. 20 illustrates the internal configuration of the regeneration controller 200 and rectifier circuit 250 shown in FIG. 6. The regeneration controller 200 comprises an phase A charge switching unit 202 and a phase B charge switching unit 204, both connected to the bus 102, and an electronically variable resistor 206. The output signals of the two charge switching units 202, 204 are applied to the input terminals of the two AND circuits 211, 212.

The phase A charge switching unit 202 outputs a signal of a "1" level when the regenerative power from the phase A coils 12A is recovered, and outputs a signal of a "0" level when the power is not recovered. The same is true for the phase B charge switching unit 204. The switching of those signal levels is conducted with the CPU 110. The presence or absence of regeneration from the phase A coils 12A and the presence or absence of regeneration from the phase B coil 12B can be set independently. Therefore, for example, electric power can be regenerated from the phase B coils 12B, while generating a drive force in the motor by using the phase A coils 12A.

The drive controller 100, similarly, may have a configuration such that whether or not the drive force is generated by using the phase A coils 12A and whether or not the drive force is generated by using the phase B coils 12B can be set independently. In such a case, the motor can be operated in an operation mode such that a drive force is generated in any one of the two sets of coils 12A, 12B, while electric power is regenerated in the other coils.

The voltage across the electronically variable resistor 206 is applied to one of the two input terminals of the four voltage comparators 221-224. The phase A sensor signal SSA and phase B sensor signal SSB are applied to the other input terminal of the voltage comparators 221-224. The output signals TPA, BTA, TPB, BTB of the four voltage comparators 221-224 can be called "mask signals" or "permission signals".

The mask signals TPA, BTA for the phase A coils are inputted into the OR circuit 231, and the mask signals TPB, BTB for the phase B are inputted into the other OR circuit 232. The outputs of those OR circuits 231, 232 are supplied to the input terminals of the above-mentioned two AND circuits 211, 212. The output signals MSKA, MSKB of those AND circuits 211, 212 are called "mask signals" or "permission signals".

The configurations of the four voltage comparators 221-224 and the two OR circuits 231, 232 are identical to two sets of the voltage comparators 594, 596, and the OR circuit 598 of the excitation interval setting unit 590 shown in FIG. 14A. Therefore, the output signal of the OR circuit 231 for the phase A coils is similar to the excitation interval signal Ea shown in FIG. 14B. Further, when the output signal of the phase A charge switching unit 202 is at a "1" level, the mask signal MSKA outputted from the AND circuit 211 for the phase A coils is identical to the output signal of the OR circuit 231. Those operations are identical to those relating to the phase B.

The rectifier circuit 250 has the circuitry for the phase A coils which includes a full-wave rectifier circuit 252 comprising a plurality of diodes, two gate transistors 261, 262, a buffer circuit 271, and an inverter circuit 272 (NOT circuit). The identical circuitry is also provided for the phase B. The gate transistors 261, 262 are connected to the power wiring 280 for regeneration. It is preferable to use Schottky diodes which have excellent characteristics of low Vf as the plurality of diodes.

During power regeneration, the AC power generated in the phase A coils 12A is rectified with the full-wave rectifier circuit 252. The mask signal MSKA for the phase A coils and the inverted signal thereof are supplied to the gates of the gate transistors 261, 262, and the gate transistors 261, 262 are ON/OFF controlled accordingly. Therefore, within a period in which at least one of the mask signals TPA, BTA outputted from the voltage comparators 221, 222 is at an H level, the regenerated power is outputted to the power source wiring 280. On the other hand, within an interval in which both mask signals TPA, BTA are at an L level, power regeneration is inhibited.

As clearly follows from the explanation provided hereinabove, the regenerated power can be recovered by using the regeneration controller 200 and rectifier circuit 250. Furthermore, the regeneration controller 200 and rectifier circuit 250 can restrict the interval in which the regenerated power from the phase A coils 12A and phase B coils 12B is recovered, according to the mask signal MSKA for the phase A coils and the mask signal MSKB for the phase B coils, thereby making it possible to adjust the quantity of the regenerated power.

As described above, the PWM control signal generator 600 of the first embodiment readily changes only the frequency of the clock signal PCL while keeping the frequency of the clock signal SDC unchanged by simply rewriting the frequency division value N. The PWM control signal generator 600 and the PWM unit 530 (FIG. 8A) correspond to the 'PWM control circuit' of the invention. The clock signal SDC and the clock signal PCL are respectively equivalent to the 'PWM period signal' and the 'PWM resolution signal' of the invention. The output S1 of the counter 531 and the drive signals DRVA1 and DRVA2 correspond to the 'PWM signal' of the invention.

B. Second Embodiment

Figure 21:
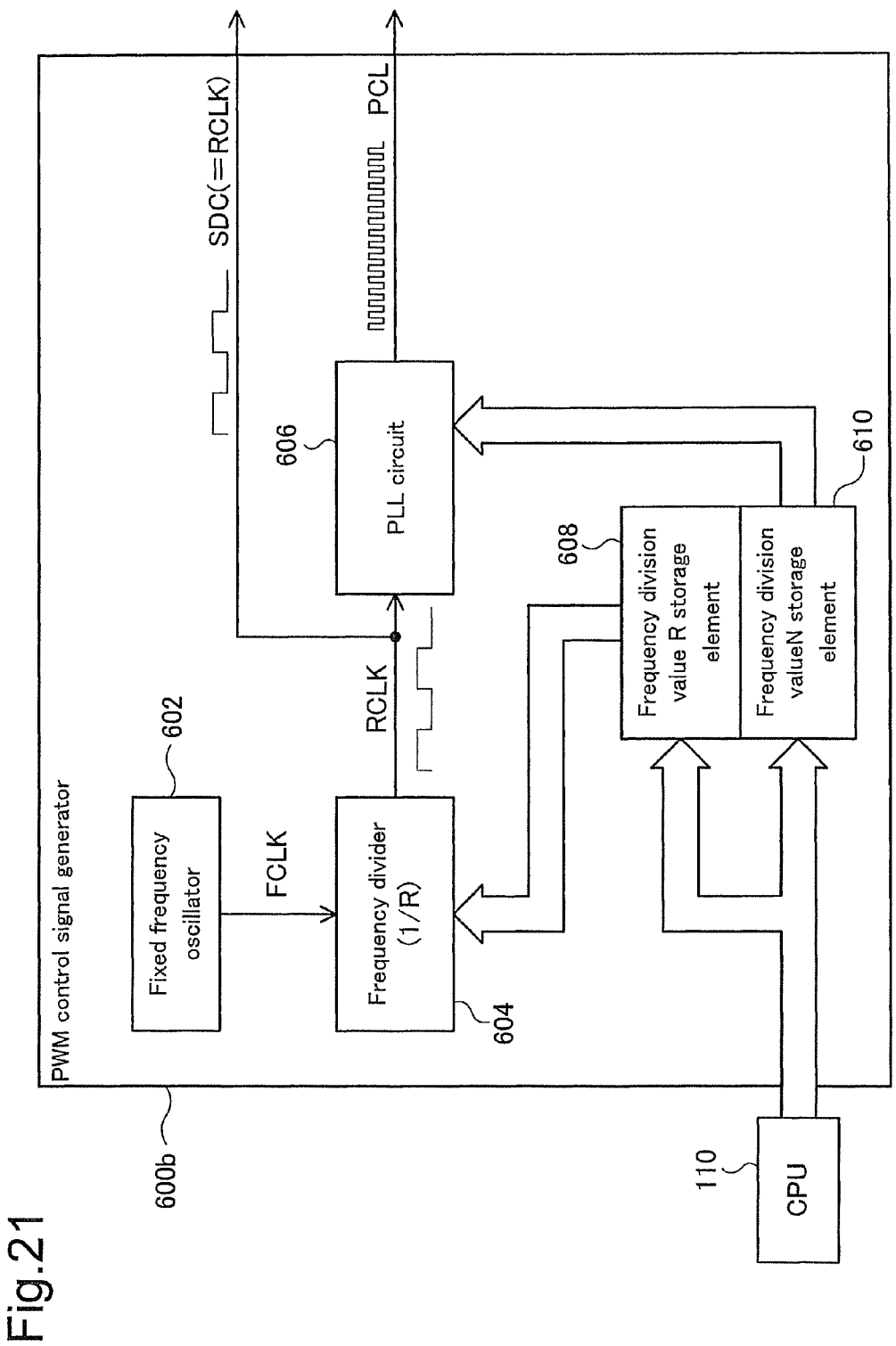
FIG. 21 is an explanatory view showing the structure of a PWM control circuit generator 600b in a second embodiment of the present invention.

FIG. 21 is an explanatory view showing the structure of a PWM control circuit generator 600b in a second embodiment of the present invention. The PWM control signal generator 600b of the second embodiment directly uses the frequency-divided clock signal RCLK as the clock signal SDC but otherwise has the similar structure to that of the PWM control signal generator 600 of the first embodiment shown in FIG. 9.

The frequency-divided clock signal RCLK and the clock signal SDC have the same frequencies. The frequency-divided clock signal RCLK is thus directly usable as the clock signal SDC on the assumption that an interval between two rising edges of the frequency-divided clock signal RCLK is one cycle of PWM control. Like the arrangement of the first embodiment, the arrangement of the second embodiment allows a change of only the frequency of the clock signal PCL while keeping the frequency of the clock signal SDC unchanged. The frequency-divided clock signal RCLK is equivalent to the 'reference signal' of the invention.

C. Modified Examples

The present invention is not limited to the embodiments described hereinabove, and may be reduced to practice in various other ways without departing from the spirit thereof. Modifications such as the following are possible, for example.

C1. Modified Example 1

The present invention is applicable to various kinds of devices. For example, the present invention is implemented in a motor in any of various devices such as fan motors, clocks (for driving the hands), drum type washing machines (single rotation), jet coasters, vibrating motors, and the like. Where the present invention is implemented in a fan motor, the various advantages mentioned previously (low power consumption, low vibration, low noise, minimal rotation irregularity, low heat emission, and long life) is particularly notable. Such fan motors can be employed, for example, as fan motors for various devices such as digital display devices, vehicle on-board devices, fuel cell type PCs, fuel cell type digital cameras, fuel cell type video cameras, fuel cell type mobile phones, various other fuel cell-powered devices, and projectors. The motor of the present invention may also be utilized as a motor for various types of household electric appliances and electronic devices. For example, a motor in accordance with the present invention may be employed as a spindle motor in an optical storage device, magnetic storage device, polygon mirror drive, or the like. The motor of the present invention may also be utilized as a motor for a movable body or a robot.

Figure 22:
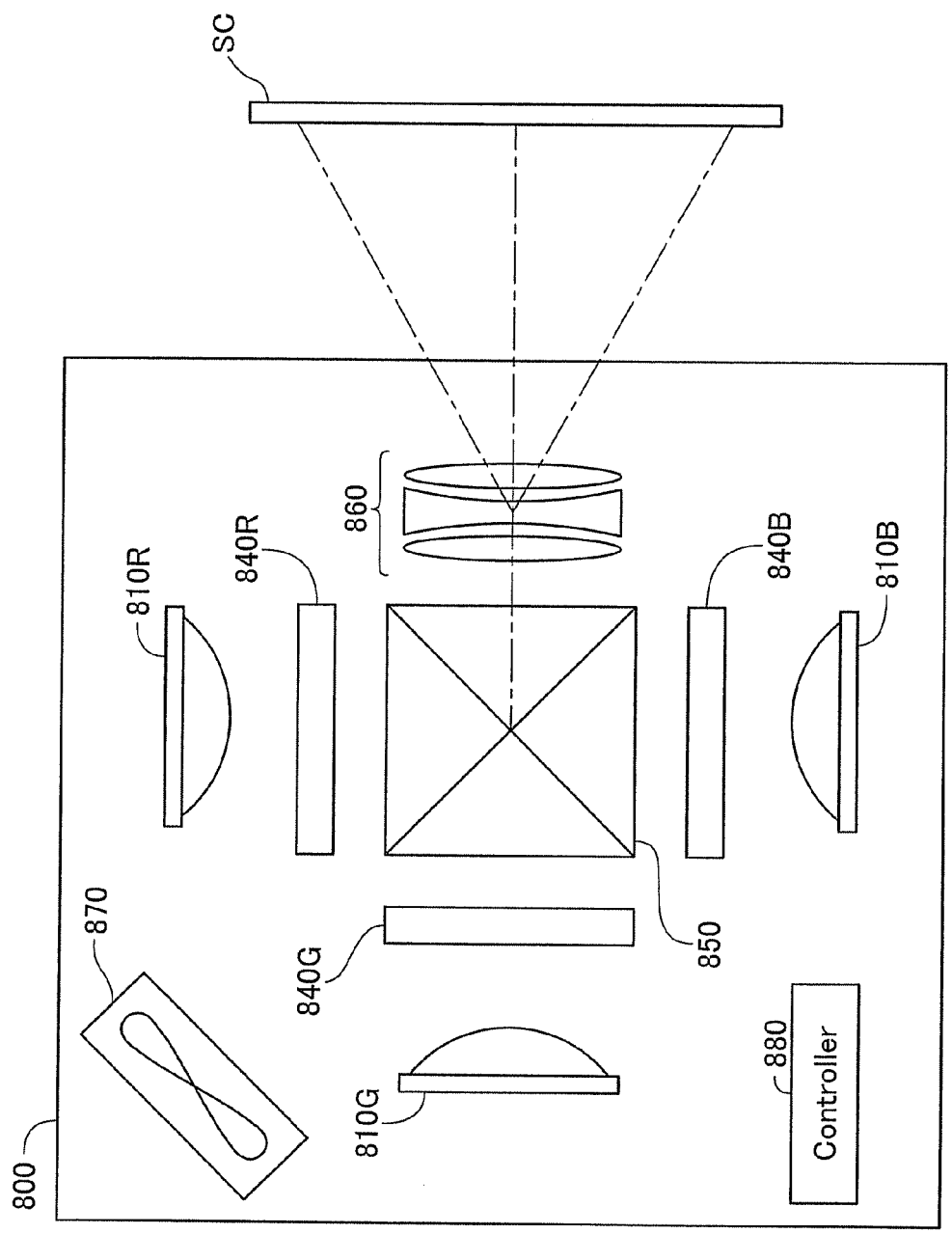
FIG. 22 is an illustration depicting a projector which utilizes a motor according to the present invention.

FIG. 22 is an illustration depicting a projector which utilizes a motor according to the present invention. This projector 800 has three light sources 810R, 810G, 810B for emitting light of the three colors red, green, and blue; liquid crystal light valves 840R, 840G, 840B for modulating light of the three colors; a cross dichroic prism 850 for synthesizing modulated light of the three colors; a projection lens system 860 for projecting light synthesized from the three colors onto a screen SC; a cooling fan 870 for cooling the interior of the projector; and a controller 880 for controlling the entire projector 800. Any of the various brushless motors described above may be used as the motor for driving the cooling fan 870.

Figure 23A:
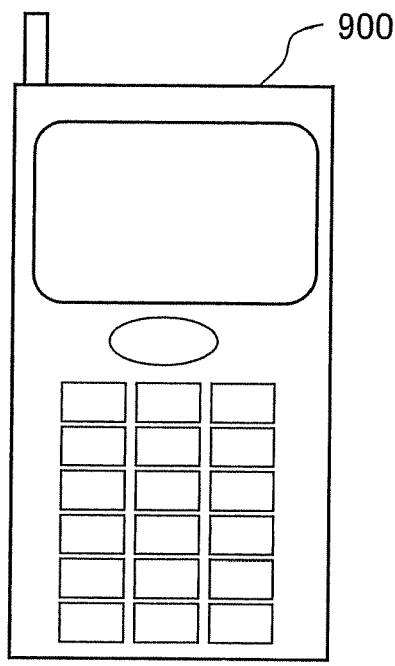
FIGS. 23A to 23C illustrate a fuel cell type mobile phone which utilizes a motor according to the present invention.
Figure 23B:
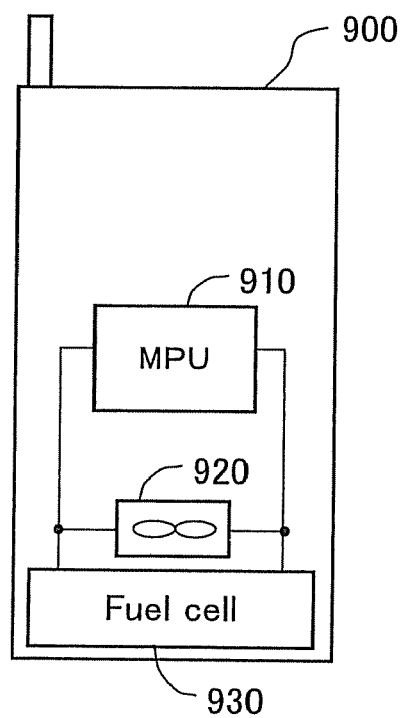
Figure 23C:
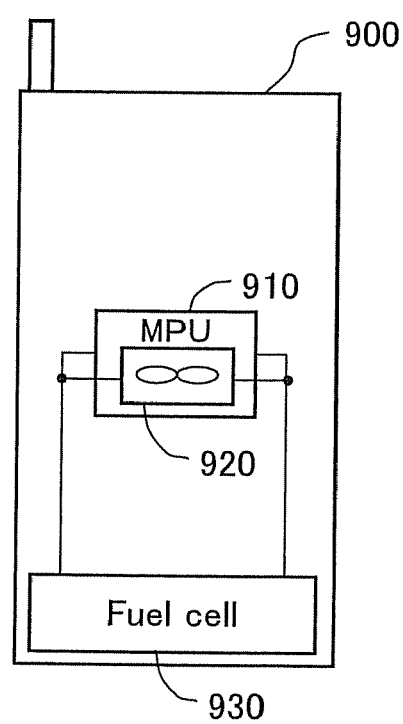

FIGS. 23A to 23C illustrate a fuel cell type mobile phone which utilizes a motor according to the present invention. FIG. 23A shows an exterior view of a mobile phone 900, and FIG. 23B shows an example of internal configuration. The mobile phone 900 includes an MPU 910 for controlling operation of the mobile phone 900; a fan 920; and a fuel cell 930. The fuel cell 930 supplies power to the MPU 910 and to the fan 920. The fan 920 blows air into the mobile phone 900 from the outside in order to supply air to the fuel cell 930, or in order to expel moisture evolved in the fuel cell 930 from the inside of the mobile phone 900 to the outside. The fan 920 may also be positioned on the MPU 910 as shown in FIG. 23C, to cool the MPU 910. Any of the various brushless motors described above can be used as the motor for driving the fan 920.

Figure 24:
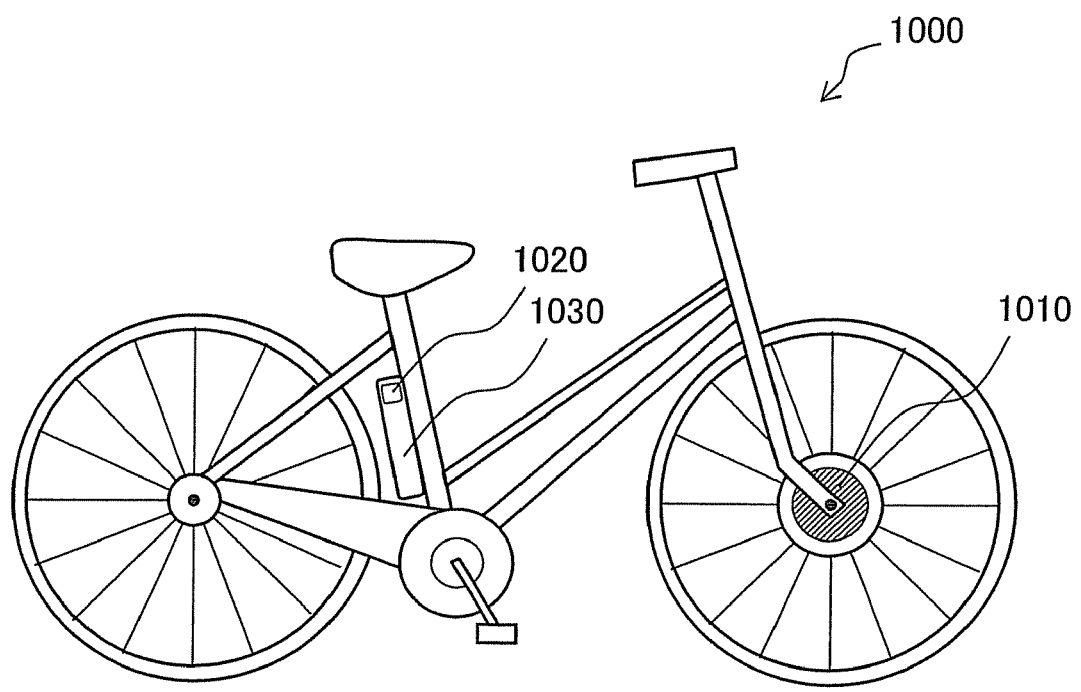
FIG. 24 is an illustration depicting an electrically powered bicycle (power assisted bicycle) as one example of a moving body that utilizes a motor/generator according to the embodiments of the present invention.

FIG. 24 is an illustration depicting an electrically powered bicycle (power assisted bicycle) as one example of a moving body that utilizes a motor/generator according to the embodiments of the present invention. This bicycle 1000 is provided with a motor 1010 on its front wheel; and with a control circuit 1020 and a rechargeable battery 1030 disposed on the frame below the saddle. The motor 1010 uses power from the rechargeable battery 1030 to drive the front wheel, thereby assisting travel. During braking, regenerative power from the motor 1010 is used to charge the rechargeable battery 1030. The control circuit 1020 is a circuit for controlling driving and regeneration of the motor. Any of the various brushless motors described above can be used as the motor 1010.

Figure 25:
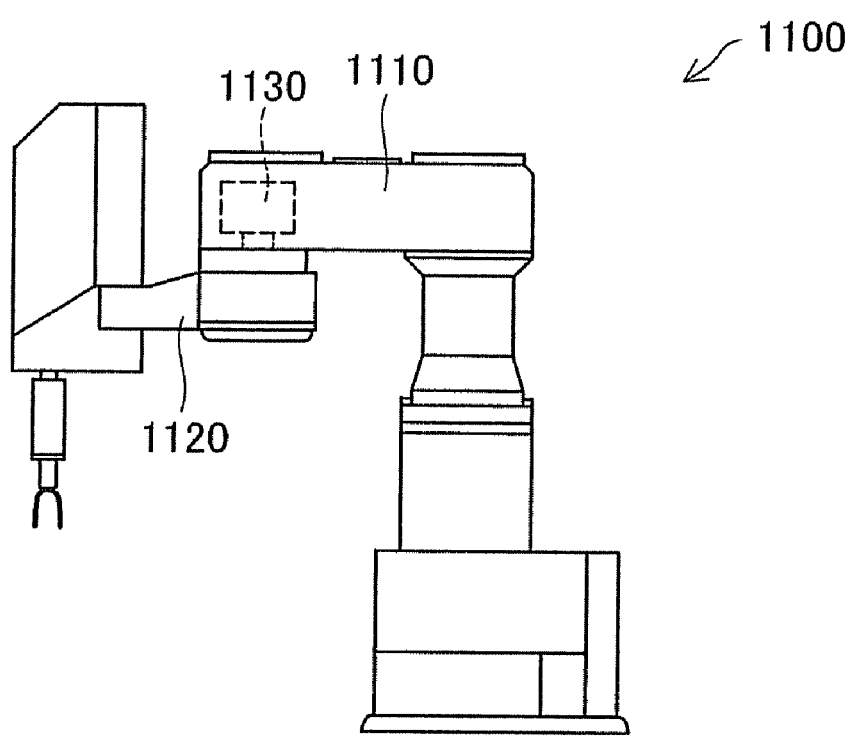
FIG. 25 is an illustration showing an example of a robot which utilizes a motor according to the embodiments of the present invention.

FIG. 25 is an illustration showing an example of a robot which utilizes a motor according to the embodiments of the present invention. This robot 1100 has first and second arms 1110, 1120, and a motor 1130. This motor 1130 is used during horizontal rotation of the second arm 1120 as the driven member. Any of the various brushless motors described above can be used as the motor 1130.

C2. Modified Example 2

The PWM control circuit of the invention is not restrictively incorporated in the brushless motor as described in the above embodiment but may be mounted on any of various devices under PWM control.

C3. Modified Example 3

The structure of the embodiment uses the analog PLL circuit 606 (FIG. 10) to implement the technique of the invention. The analog PLL circuit 606 is, however, neither essential nor restrictive but may be replaced by a digital PLL circuit or a combination of multiple digital counters arranged to have the same functions as those of the digital PLL circuit.

What is claimed is:

1. A method for generating a pulse width modulation signal, the method comprising:
    converting a phase difference between a clock signal having a standard frequency and a pulse width modulation period signal defining a period of the pulse width modulation signal to a voltage level;
    oscillating a pulse width modulation resolution signal in a specified frequency corresponding to the voltage level, the pulse width modulation resolution signal specifying a resolution to set a duty cycle in one period of the pulse width modulation period signal;
    generating the pulse width modulation period signal by dividing a frequency of the pulse width modulation resolution signal; and
    generating the pulse width modulation signal based on the pulse width modulation period signal and the pulse width modulation resolution signal.

* * * * *